US011990485B2

(12) United States Patent
Tamaki et al.

(10) Patent No.: US 11,990,485 B2
(45) Date of Patent: May 21, 2024

(54) PHOTOELECTRIC CONVERSION DEVICE HAVING A SEMICONDUCTOR SUBSTRATE WITH FIRST, SECOND AND THIRD PHOTOELECTRIC CONVERSION PORTIONS

(71) Applicant: CANON KABUSHIKI KAISHA, Tokyo (JP)

(72) Inventors: Junya Tamaki, Tokyo (JP); Keita Torii, Kanagawa (JP); Kazuya Igarashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 283 days.

(21) Appl. No.: 17/061,264

(22) Filed: Oct. 1, 2020

(65) Prior Publication Data

US 2021/0118924 A1 Apr. 22, 2021

(30) Foreign Application Priority Data

Oct. 21, 2019 (JP) ................................. 2019-192197

(51) Int. Cl.
*H01L 27/146* (2006.01)

(52) U.S. Cl.
CPC .. *H01L 27/14603* (2013.01); *H01L 27/14638* (2013.01); *H01L 27/14683* (2013.01)

(58) Field of Classification Search
CPC ......... H01L 27/14603; H01L 27/14638; H01L 27/14683; H01L 27/14627; H01L 27/14634; H01L 27/14636; H01L 27/14614; H01L 27/1463; H01L 27/1464; H01L 27/14641

(Continued)

(56) References Cited

U.S. PATENT DOCUMENTS 11,088,191 B2 * 8/2021 Ogawa ................. H01L 31/112
2012/0188397 A1 7/2012 Ohta
(Continued)

FOREIGN PATENT DOCUMENTS

JP 2009-238985 A 10/2009
JP 2012-84816 A 4/2012
(Continued)

OTHER PUBLICATIONS

Japanese Search Report dated Oct. 31, 2023 in corresponding Japanese Patent Application No. 2019-192197 (English translation included).

(Continued)

*Primary Examiner* — Thanh Luu
*Assistant Examiner* — Mai Thi Ngoc Tran
(74) *Attorney, Agent, or Firm* — VENABLE LLP

(57) ABSTRACT

A photoelectric conversion device in the present disclosure includes a first trench extending inside a semiconductor substrate from a first face of the semiconductor substrate between a first photoelectric conversion portion and a second photoelectric conversion portion arranged in a first pixel and a second trench extending from a second face of the semiconductor substrate between the first pixel and a second pixel, and the end on the second face side of the first isolation portion is located closer to the second face side than the end on the first face side of the second isolation portion.

31 Claims, 21 Drawing Sheets

(58) Field of Classification Search
USPC .............................................. 250/208.1, 239
See application file for complete search history.

(56) References Cited

U.S. PATENT DOCUMENTS

| | | | |
|---|---|---|---|
| 2013/0193547 A1 | 8/2013 | Nakazawa | |
| 2014/0054662 A1 | 2/2014 | Yanagita | |
| 2014/0131779 A1* | 5/2014 | Takeda | H01L 27/14603 257/292 |
| 2014/0160335 A1* | 6/2014 | Shimotsusa | H01L 27/14627 438/69 |
| 2014/0300786 A1 | 10/2014 | Okita | |
| 2015/0145087 A1 | 5/2015 | Iwata | |
| 2015/0349011 A1 | 12/2015 | Kato | |
| 2016/0141323 A1 | 5/2016 | Igarashi et al. | 257/432 |
| 2016/0234449 A1 | 8/2016 | Ishiwata | |
| 2017/0077155 A1 | 3/2017 | Sano | |
| 2017/0104020 A1 | 4/2017 | Lee | |
| 2017/0317117 A1 | 11/2017 | Ukigaya | |
| 2017/0345853 A1 | 11/2017 | Kato | |
| 2018/0182802 A1 | 6/2018 | Tange | |
| 2018/0213174 A1 | 7/2018 | Sano | |
| 2018/0350856 A1 | 12/2018 | Masagaki | |
| 2018/0359434 A1 | 12/2018 | Tanaka | |
| 2019/0006399 A1 | 1/2019 | Otake | |
| 2019/0043901 A1 | 2/2019 | Honda | |
| 2019/0088701 A1 | 3/2019 | Mizuta | |
| 2019/0148457 A1 | 5/2019 | Lee | |
| 2019/0214421 A1 | 7/2019 | Kim | |
| 2019/0252425 A1 | 8/2019 | Ogawa | |
| 2020/0127031 A1 | 4/2020 | Suzuki et al. | H01L 27/14629 |
| 2020/0135793 A1 | 4/2020 | Torii et al. | H01L 27/14636 |
| 2020/0219916 A1 | 7/2020 | Igarashi | G05D 1/0246 |

FOREIGN PATENT DOCUMENTS

| | | |
|---|---|---|
| JP | 2013-98446 A | 5/2013 |
| JP | 2013-149757 A | 8/2013 |
| JP | 2014-116472 A | 6/2014 |
| JP | 2015-103606 A | 6/2015 |
| JP | 2015-228467 A | 12/2015 |
| JP | 2016-225597 A | 12/2016 |
| JP | 2017-191950 A | 10/2017 |
| JP | 2017-199875 A | 11/2017 |
| JP | 2018-107359 A | 7/2018 |
| JP | 2018-201005 A | 12/2018 |
| JP | 2018-201015 A | 12/2018 |
| JP | 2018-206837 A | 12/2018 |
| JP | 2019-110345 A | 7/2019 |
| JP | 2019-122045 A | 7/2019 |
| JP | 2019-134186 A | 8/2019 |
| JP | 2019-140251 A | 8/2019 |
| JP | 2019-145544 A | 8/2019 |
| JP | 2019-165136 A | 9/2019 |
| WO | 2017/130723 A | 8/2017 |

OTHER PUBLICATIONS

Japanese Office Action issued Mar. 26, 2024 in corresponding Japanese Patent Application No. 2019-192197 (English translation included) .

* cited by examiner

PHOTOELECTRIC CONVERSION DEVICE HAVING A SEMICONDUCTOR SUBSTRATE WITH FIRST, SECOND AND THIRD PHOTOELECTRIC CONVERSION PORTIONS

BACKGROUND OF THE INVENTION

Field of the Invention

The present invention relates to a photoelectric conversion device, a manufacturing method of the photoelectric conversion device, and an imaging system.

Description of the Related Art

In a photoelectric conversion device, a technique to form an element isolation structure between a plurality of elements to prevent crosstalk between photoelectric conversion portions is known. International Publication No. WO2017/130723 discloses a technique to form an element isolation portion from a substrate back surface side that is a light incident face opposite to a substrate front surface on which a photoelectric conversion portion is formed. Further, Japanese Patent Application Laid-Open No. 2019-140251 discloses a technique to form an element isolation portion from a substrate front surface between a plurality of pixels and between a plurality of photoelectric conversion portions forming pixels.

In International Publication No. WO2017/130723, however, since the isolation portion is formed from the substrate back surface side to the substrate front surface in which the photoelectric conversion portion is arranged, a position of the isolation portion for the photoelectric conversion portion may be shifted and isolation performance may be reduced. Further, in Japanese Patent Application Laid-Open No. 2019-140251, since the isolation portion formed between the plurality of photoelectric conversion portions is formed in the same manner as the isolation portion formed between the plurality of pixels, sufficient isolation performance is not necessarily obtained.

The present invention has been made in view of the above problem and intends to provide a photoelectric conversion device, a manufacturing method of the photoelectric conversion device, and an imaging system in which isolation performance can be improved.

SUMMARY OF THE INVENTION

According to one embodiment of the present disclosure, provided is a photoelectric conversion device having a first pixel and a second pixel, and the photoelectric conversion device includes: a semiconductor substrate having a first face and a second face that is arranged on an opposite side of the first face and receives light, wherein a plurality of photoelectric conversion portions are arranged between the first face and the second face. The semiconductor substrate includes a first trench extending from the first face between a first photoelectric conversion portion of the first pixel and a second photoelectric conversion portion of the first pixel and a second trench extending from the second face between the first pixel and the second pixel, an end on the second face side of the first trench is located closer to the second face side than an end on the first face side of the second trench, and the first trench has a portion of a first width and a portion of a second width in a cross section taken along a direction in which the first photoelectric conversion portion and the second photoelectric conversion portion are arranged, the first width is narrower than the second width, and the portion of the first width is closer to the second face than the portion of the second width.

According to another embodiment of the present disclosure, provided is a photoelectric conversion device having a first pixel and a second pixel, and the photoelectric conversion device includes: a semiconductor substrate having a first face and a second face that is arranged on an opposite side of the first face and receives light, wherein a plurality of photoelectric conversion portions are arranged between the first face and the second face. The semiconductor substrate includes a first trench extending from the first face between a first photoelectric conversion portion of the first pixel and a second photoelectric conversion portion of the first pixel and a second trench extending from the second face between the first pixel and the second pixel, an end on the second face side of the first trench is located closer to the second face side than an end on the first face side of the second trench, and the first trench does not reach the second face.

According to yet another embodiment of the present disclosure, provided is a manufacturing method of a photoelectric conversion device including a semiconductor substrate having a first face and a second face that is arranged on an opposite side of the first face and receives light. The manufacturing method includes steps of: forming a first pixel and a second pixel in the first face; forming a first trench from the first face between a first photoelectric conversion portion arranged in the first pixel and a second photoelectric conversion portion arranged in the first pixel; and forming a second trench from the second face between the first pixel and the second pixel. An end on the second face side of the first trench is located closer to the second face side than an end on the first face side of the second trench, and the first trench has a portion of a first width and a portion of a second width in a cross section taken along a direction in which the first photoelectric conversion portion and the second photoelectric conversion portion are arranged, the first width is narrower than the second width, and the portion of the first width is closer to the second face than the portion of the second width.

Further features of the present invention will become apparent from the following description of exemplary embodiments with reference to the attached drawings.

DESCRIPTION OF THE EMBODIMENTS

First Embodiment

Figure 1:
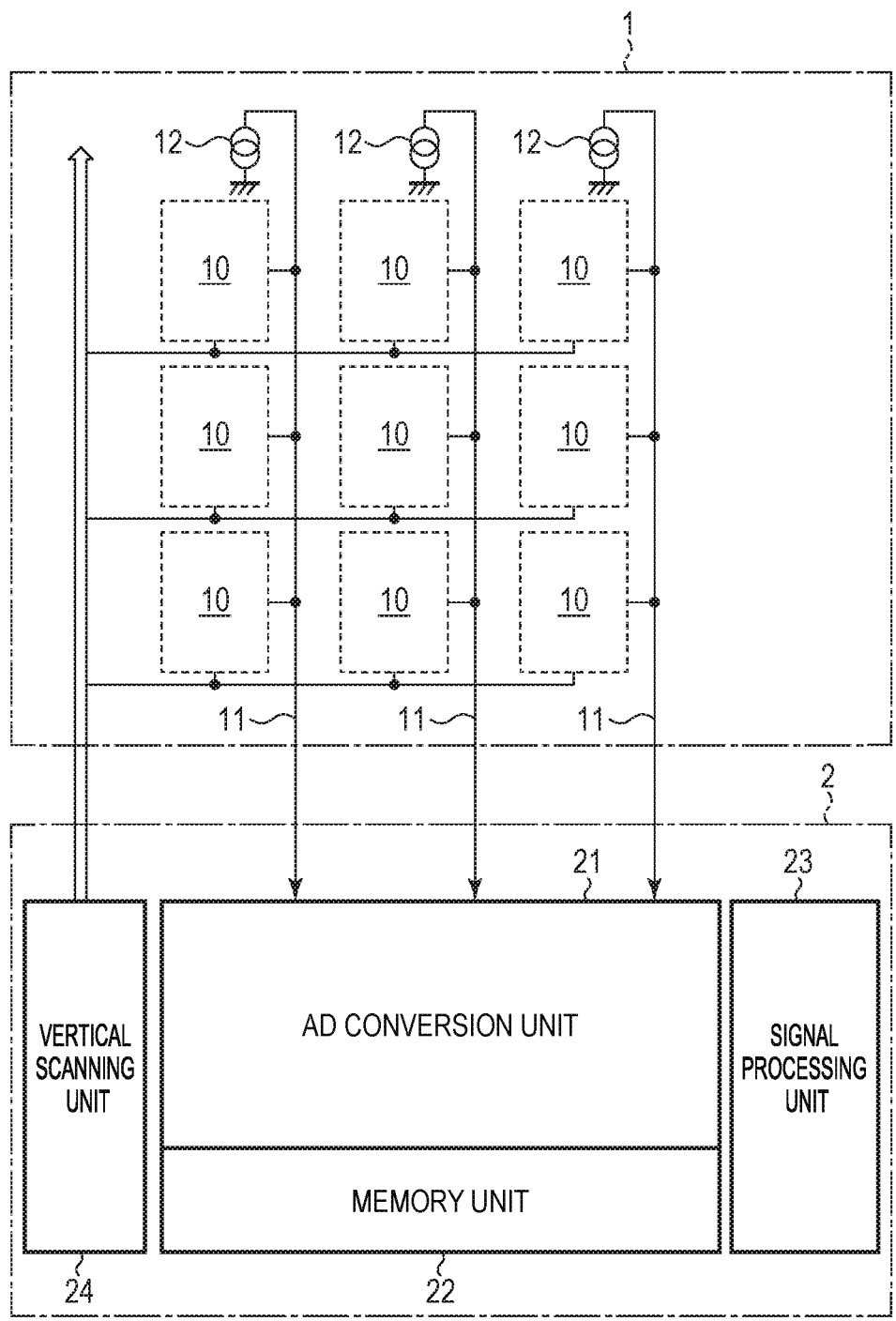
FIG. 1 is a block diagram of a photoelectric conversion device in a first embodiment of the present invention.

FIG. 1 is a block diagram of a photoelectric conversion device in the present embodiment. The photoelectric conversion device is a so-called back-side illuminated type solid state imaging device and has a photoelectric conversion substrate (semiconductor substrate) 1 and a circuit element substrate (another semiconductor substrate) 2 that are stacked on each other.

The photoelectric conversion substrate 1 has a plurality of pixels 10 that generate signals in accordance with incident light, and the plurality of pixels 10 are arranged in a matrix. In FIG. 1, while the pixels 10 arranged in three rows by three columns are illustrated for simplified illustration, the number of pixels 10 arranged in the row direction and the number of pixels 10 arranged in the column direction are not particularly limited. Note that, in the present specification, the row direction indicates the horizontal direction in each drawing, and the column direction indicates the vertical direction in each drawing. Micro-lenses or color filters may be arranged on the pixels 10. The color filters are primary color filters of red, blue, and green, for example, and are provided on respective pixels 10 in accordance with the Bayer arrangement. Some of the pixels 10 are shielded from light as optical black pixels (OB pixels). A ranging row on which focus detection pixels that output pixel signals for focus detection are arranged and a plurality of imaging rows on which imaging pixels that output pixel signals for generating an image are arranged may be provided in the plurality of pixels 10. A signal line 11 is provided for each column of the pixels 10 and is electrically connected to a constant current source 12.

The circuit element substrate 2 has an analog-to-digital conversion unit (AD conversion unit) 21, a memory unit 22, a signal processing unit 23, and a vertical scanning unit 24.

The analog-to-digital conversion unit 21 has an amplification circuit, a comparator, a ramp signal generation circuit, a counter circuit, or the like. The amplification circuit amplifies an analog signal output from the pixels 10 to the signal line 11 and inputs the signal to one input terminal of the comparator. The ramp signal generation circuit generates a ramp signal that changes with time and inputs the ramp signal to the other input terminal of the comparator. The comparator compares analog signal with the ramp signal and outputs a comparison signal. The counter circuit counts the period from the beginning of the change of the ramp signal to the inversion of the comparison signal and outputs a count value as digital data.

The memory unit 22 holds digital data output from the analog-to-digital conversion unit 21. The memory unit 22 may hold digital data on a row basis or on a frame basis. Moreover, the memory unit 22 may have a scanning circuit that outputs the held digital data as serial data or parallel data.

The signal processing unit 23 has a digital signal processing circuit, a calculation processing circuit, or the like and performs signal processing of digital data output from the memory unit 22. For example, the signal processing may be any one or more of a noise reduction process, a dynamic range expansion process, a white balance process, a shutter reading process, and a demosaic process. The digital data output from the signal processing unit 23 is output to the outside of the photoelectric conversion device.

The vertical scanning unit 24 includes a shift register, a gate circuit, or the like and supplies a plurality of control signals to the pixels 10. That is, the vertical scanning unit 24 drives transistors forming the pixels 10 and reads out the pixels 10 on a row basis.

Figure 2:
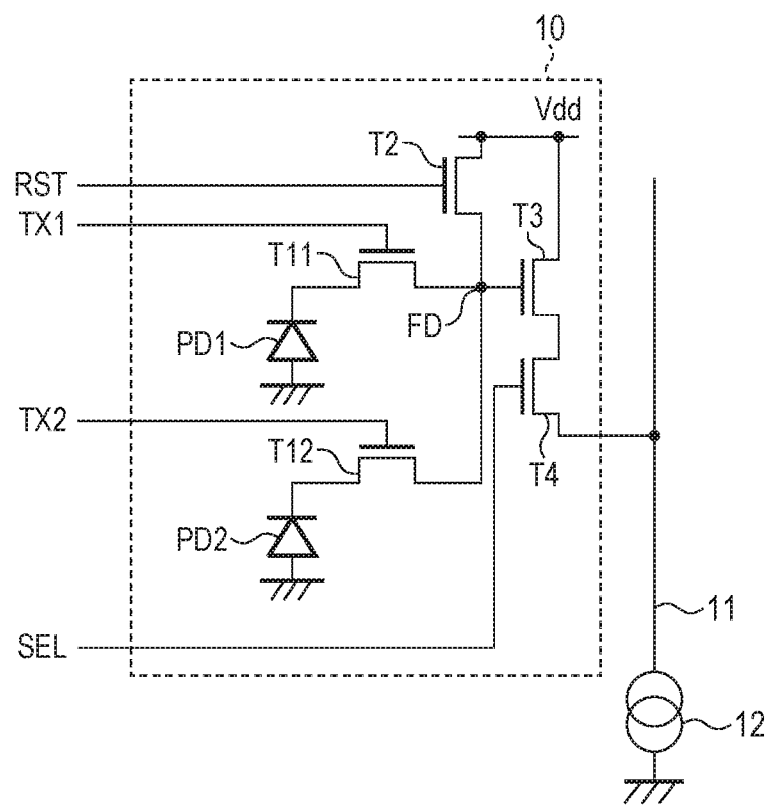
FIG. 2 is an equivalent circuit diagram of a pixel in the first embodiment of the present invention.

FIG. 2 is an equivalent circuit diagram of a pixel in the present embodiment. The pixel 10 includes photoelectric conversion portions PD1 and PD2, a floating diffusion region FD, transfer transistors T11 and T12, a reset transistor T2, an amplifier transistor T3, and a select transistor T4. The following description illustrates an example in which each transistor forming the pixel 10 is an N-type MOS transistor. The photoelectric conversion portions PD1 and PD2 are each formed of a photodiode, for example, perform photoelectric conversion in accordance with incident light and generation and accumulation of charges. The transfer transistors T11 and T12 are provided in association with the photoelectric conversion portions PD1 and PD2, and control signals TX1 and TX2 are supplied to respective gates thereof. When the control signal TX1 is at a high level, the transfer transistor T11 is in an on-state (conductive state), and a signal of the photoelectric conversion portion PD1 is transferred to the floating diffusion region FD that is the input node of the amplifier transistor T3. Further, when the control signal TX2 is at a high level, a signal of the photoelectric conversion portion PD2 is transferred to the floating diffusion region FD. When a control signal RST is supplied to the gate of the reset transistor T2 and the reset transistor T2 is turned on, the potential of the floating diffusion region FD is reset to a power source voltage Vdd. The floating diffusion region FD has a predetermined capacitance and generates a voltage in accordance with the charges. The amplifier transistor T3 operates as a source follower in which the potential of the source changes in accordance with the potential of the floating diffusion region FD. The select transistor T4 electrically connects the source of the amplifier transistor T3 to the signal line 11. The constant current source 12 that functions as a load of the amplifier transistor T3 is connected to the signal line 11. When a control signal SEL on a row to be read out is controlled to a high level, the select transistor T4 is turned on, and a voltage (analog signal) in accordance with charges of the photoelectric conversion portions PD1 and PD2 on the row is output to the signal line 11.

The transistor forming the pixel 10 is not limited to an N-type MOS transistor and may be a P-type MOS transistor. The configuration of the pixel 10 is also not limited to the example illustrated in FIG. 2, and various pixels can be used. For example, the number of photoelectric conversion portions is also not limited, and four or more photoelectric conversion portions may be provided in the pixel 10. Further, charges of the photoelectric conversion portions PD1 and PD2 may be transferred to different floating diffusion regions, respectively. Moreover, the pixel 10 may have an overflow drain that discharges charges overflowing from the photoelectric conversion portions PD1 and PD2.

Figure 3:
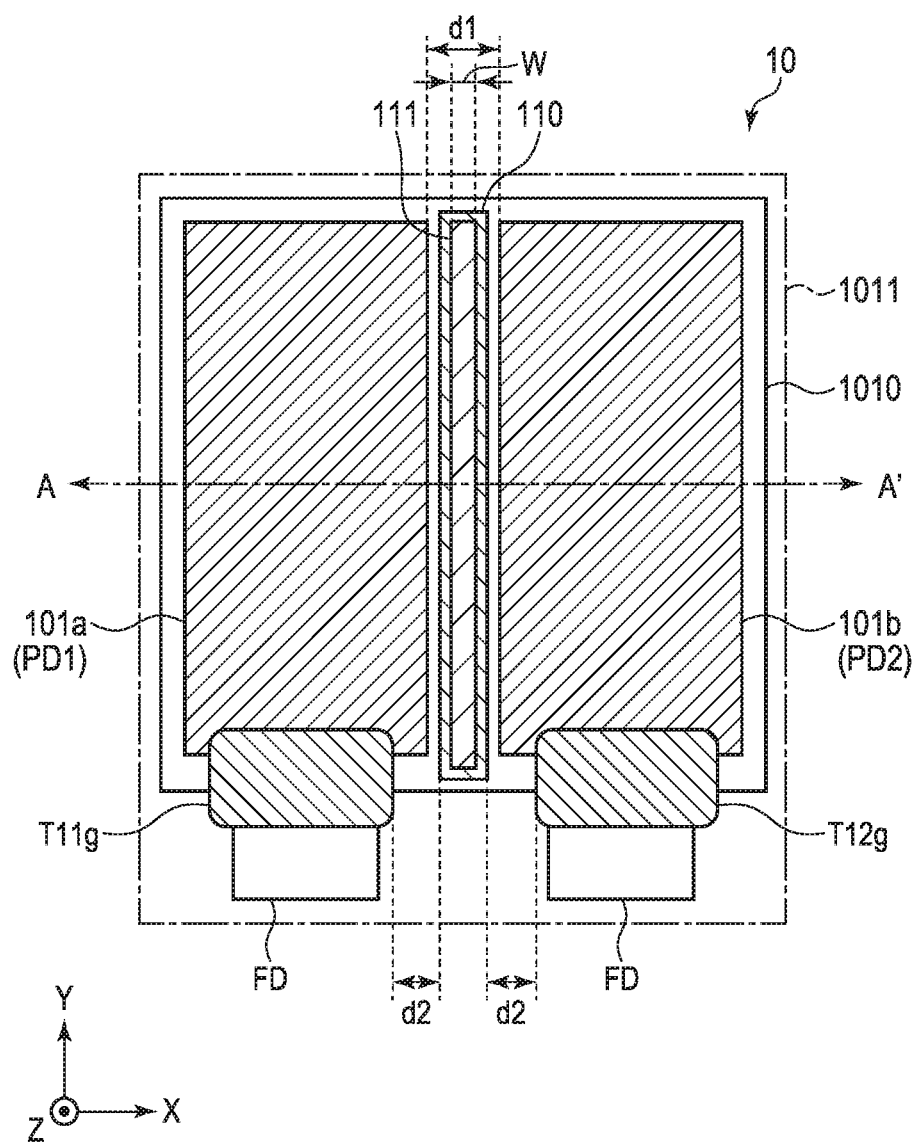
FIG. 3 is a plan view of the photoelectric conversion device in the first embodiment of the present invention.

FIG. 3 is a plan view of the photoelectric conversion device in the present embodiment and illustrates a part of the pixel 10. Herein, charge accumulation regions 101a and 101b, an active region 1010, a P-type semiconductor region 1011, the floating diffusion region FD, and gate electrodes T11g and T12g are illustrated. The pixel 10 is formed on a substrate, and the charge accumulation regions 101a and 101b are arranged adjacent to each other in plan view of a substrate (semiconductor substrate) 100. In a face parallel to the front face of the substrate 100, the direction in which the charge accumulation regions 101a and 101b are arranged is an X direction (first direction), and the direction crossing the X direction is a Y direction (second direction). Further, the inward direction from the front face of the substrate 100 is a Z direction (third direction). Further, in the following description, carriers are electrons. Note that holes can be carriers and in such a case, the polarities of the N-type and P-type are opposite to the following description.

The active region 1010 is a region surrounded by an isolation structure such as a field oxide film. The active region 1010 and the N-type charge accumulation regions 101a and 101b are provided on the P-type semiconductor region 1011. The boundary between the charge accumulation regions 101a and 101b and the semiconductor region 1011 forms a P-N junction. That is, the P-N junction between the charge accumulation region 101a and the semiconductor region 1011 forms the photoelectric conversion portion PD1, and the P-N junction between the charge accumulation region 101b and the semiconductor region 1011 forms the photoelectric conversion portion PD2. The light passing through one micro-lens causes each of the photoelectric conversion portions PD1 and PD2 to generate signal charges, and the signal charges are accumulated in the charge accumulation regions 101a and 101b.

A part of each of the gate electrodes T11g and T12g overlaps each of the charge accumulation regions 101a and 101b in plan view. The gate electrodes T11g and T12g are each formed of poly-silicon or the like and function as the gates of the transfer transistors T11 and T12. The charge accumulation region 101a and the floating diffusion region FD share the source/drain region of the transfer transistor T11. When a voltage is supplied to the gate electrode T11g, charges are transferred from the charge accumulation region 101a to the floating diffusion region FD. Similarly, the charge accumulation region 101b and the floating diffusion region FD share the source/drain region of the transfer transistor T12. When a voltage is supplied to the gate electrode T12g, charges are transferred from the charge accumulation region 101b to the floating diffusion region FD. The pixel 10 outputs a first signal based on signal charges accumulated in the charge accumulation region 101a and a second signal based on signal charges accumulated in the charge accumulation region 101b. Focus detection in a phase difference scheme can be performed by using the first signal and the second signal.

The charge accumulation regions 101a and 101b are spaced apart from each other in the X direction at a distance d1 in plan view. The isolation structure (insulating isolation structure) 110 formed to a shallow part in the inward direction (−Z direction) from the front face of the substrate 100 is arranged between the charge accumulation regions 101a and 101b. The isolation structure 110 is formed in a long and narrow shape in plan view, and the length of the isolation structure 110 in the longitudinal direction (Y direction) is substantially the same as or longer than the length of the charge accumulation regions 101a and 101b in the longitudinal direction. Further, a first trench 111 formed to a deep part in the −Z direction is arranged between the charge accumulation regions 101a and 101b. In plan view, the first trench 111 is arranged inside the isolation structure 110, and the isolation structure 110 is formed to surround the first trench 111. The first trench 111 is formed in a long and narrow shape in plan view in the same manner as the isolation structure 110, and the length of the first trench 111 in the longitudinal direction is substantially the same as or longer than the length of the charge accumulation regions 101a and 101b in the longitudinal direction. The first trench 111 can suppress crosstalk between the photoelectric conversion portions PD1 and PD2.

Further, the gate electrodes T11g and T12g are formed spaced apart from each other in the X direction from the isolation structure 110 at a distance d2 in plan view. Thus, the gate electrodes T11g and T12g can avoid a defect due to a level difference of the isolation structure 110 as described later.

Figure 4:
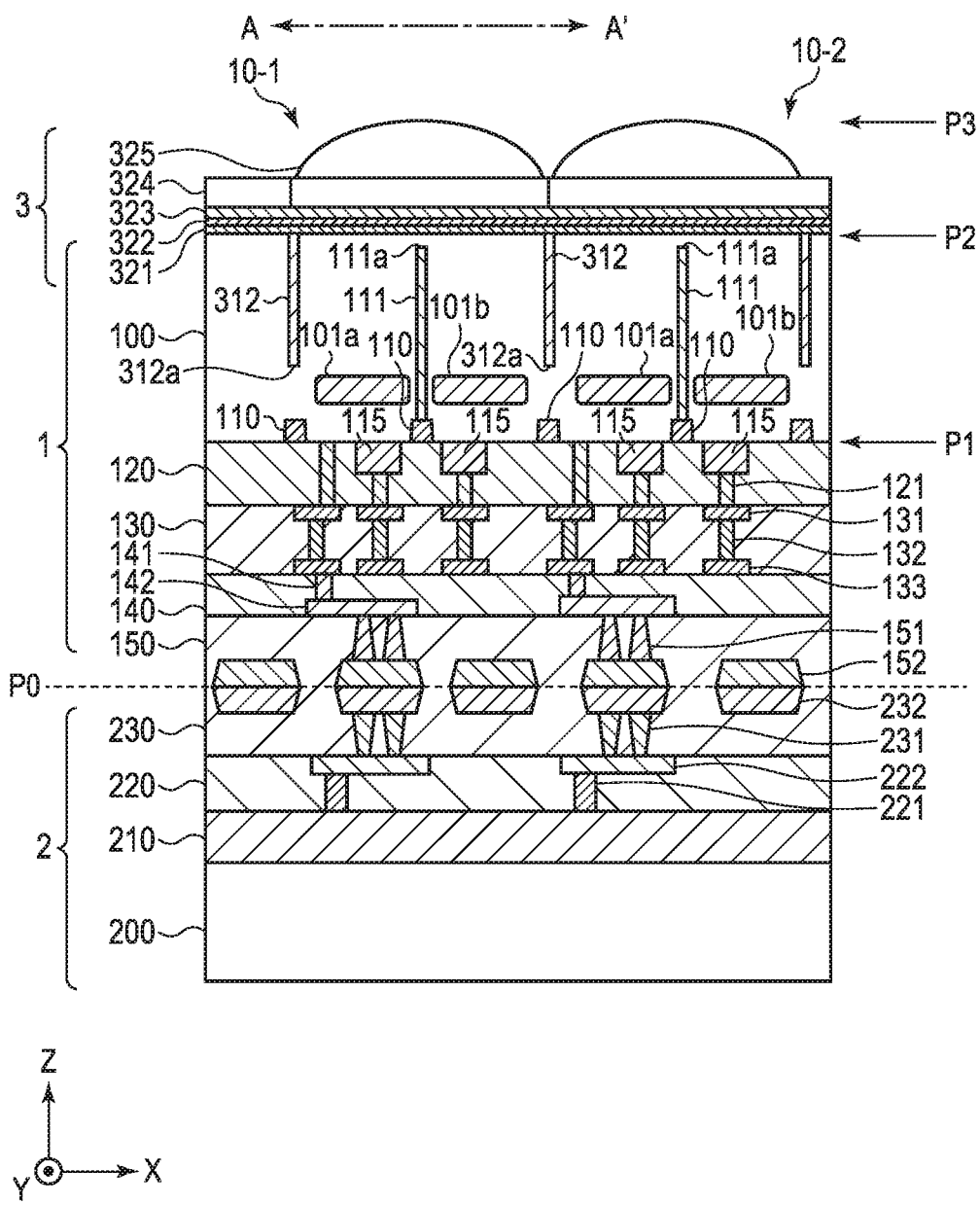
FIG. 4 is a sectional view of the photoelectric conversion device in the first embodiment of the present invention.

FIG. 4 is a sectional view of the photoelectric conversion device in the present embodiment and is a sectional view taken along a line A-A' of FIG. 3. The photoelectric conversion device has a photoelectric conversion substrate 1 and the circuit element substrate 2 that are stacked on each other. The front face of the photoelectric conversion substrate 1 and the front face of the circuit element substrate 2 are attached to each other and form a bonding interface P0. An optical structure 3 is formed on a face opposite to the bonding interface P0 in the photoelectric conversion substrate 1, that is, the back face P2 of the photoelectric conversion substrate 1. The photoelectric conversion device receives incident light from a light incident face P3 of the optical structure 3.

The photoelectric conversion substrate 1 has a substrate 100, interlayer insulating films 120, 130, 140, and 150, and a gate electrode 115. The gate electrodes T11g and T12g are formed in the same layer as the gate electrode 115. The substrate 100 is formed of a semiconductor substrate such as a silicon, and the charge accumulation regions 101a and 101b, the first trench (first isolation portion) 111, the second trench (second isolation portion) 312, and an isolation structure 110 are formed in the substrate 100. The substrate 100 is also called semiconductor layer. The semiconductor layer also has the front face P1 and the back face P2.

The first trench 111 extends from the front face (first face) P1 of the substrate 100 to the inside of the substrate 100 (Z direction). The first trench 111 may be formed of an insulating film such as a silicon nitride film or a silicon oxide film. In the present embodiment, the first trench 111 extends to a part near a back face P2 of the substrate 100 but does not reach the back face (second face) P2. Herein, the front face P1 and the back face P2 refer to faces that are substantially parallel to each other and does not include the side face (side wall) of the first trench 111. The first trench 111 has a width W that is narrower than the distance d1 at a position corresponding to the distance d1 of FIG. 3. It is desirable that the first trench 111 has sufficient width and depth so that crosstalk between the photoelectric conversion portions PD1 and PD2 can be sufficiently suppressed. For example, when the thickness of the substrate 100 is around 3.0 to 5.0 µm, it is preferable that the first trench 111 has a width of around 0.1 µm to 0.3 µm and a depth of around 1.0 to 3.0 µm.

The isolation structure 110 is formed in a direction (Z direction) from the front face P1 of the substrate 100 to the inside of the substrate 100, and the depth from the front face P1 of the isolation structure 110 is smaller than the depth from the front face P1 of the first trench 111. The isolation structure 110 is arranged between adjacent elements such as transistors and electrically isolates respective semiconductor regions. In FIG. 4, the isolation structures 110 are arranged between the adjacent pixels 10-1 and 10-2 and between the charge accumulation regions 101a and 101b, respectively. The first trench 111 is further arranged at a position of the isolation structure 110 between the charge accumulation regions 101a and 101b.

The second trench 312 extends in a direction (−Z direction) from the back face P2 of the substrate 100 to the inside of the substrate 100 between the pixels 10-1 and 10-2. An end portion (end) 312a of the second trench 312 is located closer to the front face P1 side than an end portion (end) 111a of the first trench 111. That is, the end portion 111a of the first trench 111 is located closer to the back face P2 side than the end portion 312a of the second trench 312. Further, the first trench 111 and the second trench 312 do not penetrate through the substrate 100 but are formed sufficiently deep in the substrate 100. The sum of the depth from the front face P1 of the first trench 111 and the depth from the back face P2 of the second trench 312 is larger than the distance between the first face and the second face. In FIG. 4, while the end portion 312a of the second trench 312 is located closer to the back face P2 side than the charge accumulation regions 101a and 101b, the end portion 312a may extend closer to the front face P1 side than the charge accumulation regions 101a and 101b. The isolation structure 110 may be arranged on the vertical line on the front face P1 side of the second trench 312. The second trench 312 may be formed of an insulating film such as a silicon nitride film or a silicon oxide film in the same manner as the first trench 111.

The gate electrodes T11g and T12g are formed on the front face P1 of the substrate 100 so as to interpose a gate insulating film. The gate electrodes T11g and T12g are each formed of a poly-silicon electrode or a metal electrode such as Al or Cu and arranged between a source region and a drain region (not illustrated). The interlayer insulating film 120 is formed on the gate electrodes T11g and T12g. A contact plug 121 is formed in the interlayer insulating film 120 and electrically connected to the gate electrodes T11g and T12g or the like. A wiring 131 is formed on the interlayer insulating film 120 and formed of Al, Cu, or the like. The wiring 131 is electrically connected to the contact plug 121. The interlayer insulating film 130 is formed on the interlayer insulating film 120, and a via plug 132 and a wiring 133 are further formed in the interlayer insulating film 130. An interlayer insulating film 140 is formed on the interlayer insulating film 130, and a plug 141 and a wiring 142 are formed in the interlayer insulating film 140. An interlayer insulating film 150 is formed on the interlayer insulating film 140, and a conductive member 151 and a bonding member 152 are formed in the interlayer insulating film 150. Further, an opening that reaches a pad electrode included in a wiring layer in the photoelectric conversion substrate 1 or the circuit element substrate 2 may be formed in the substrate 100.

The circuit element substrate 2 has a substrate 200, an element function layer 210, and interlayer insulating films 220 and 230. The substrate 200 is formed of a semiconductor substrate such as a silicon, and transistors forming the analog-to-digital conversion unit 21, the memory unit 22, the signal processing unit 23, and the vertical scanning unit 24 illustrated in FIG. 1, wirings, and element isolation structures are formed in the element function layer 210 on the substrate 200. A plug 221 and a wiring 222 are formed in the interlayer insulating film 220, and a conductive member 231 and a bonding member 232 are formed in the interlayer insulating film 230. The bonding member 232 is joined to the bonding member 152 of the photoelectric conversion substrate 1.

The optical structure 3 is provided on the back face P2 of the substrate 100 and includes a metal oxide film 321, an antireflection film 322, an insulating film 323, a color filter 324, and a micro-lens 325. The metal oxide film 321 is formed of a hafnium oxide film, an aluminum oxide film, or the like and formed on the back face P2 of the substrate 100. The antireflection film 322 is formed of a tantalum oxide film or the like and formed on the metal oxide film 321. The insulating film 323 is formed of a silicon oxide film, a silicon nitride film, a silicon oxynitride film, a carbon-contained silicon oxide film, a fluorine-contained silicon oxide film, or the like and formed on the antireflection film 322. The color filters 324 may be primary color filters of red, blue, and yellow, or complementary color filters of cyan, magenta, yellow, and green. A layer configuration of the film may be a single layer configuration formed of a single type of material or may be a multilayer configuration made of a plurality of materials. Further, a light-shielding film forming an optical black (OB) region made of a metal film such as tungsten or a light-shielding wall for preventing a color mixture of the incident light of each pixel may be formed in the insulating film 323. Further, an opening that reaches a pad electrode included in a wiring layer in the photoelectric conversion substrate 1 or the circuit element substrate 2 may be formed in the metal oxide film 321, the antireflection film 322, and the insulating film 323.

Next, a manufacturing method of the photoelectric conversion device in the present embodiment will be described with reference to FIG. 5A to FIG. 5F.

Figure 5A:
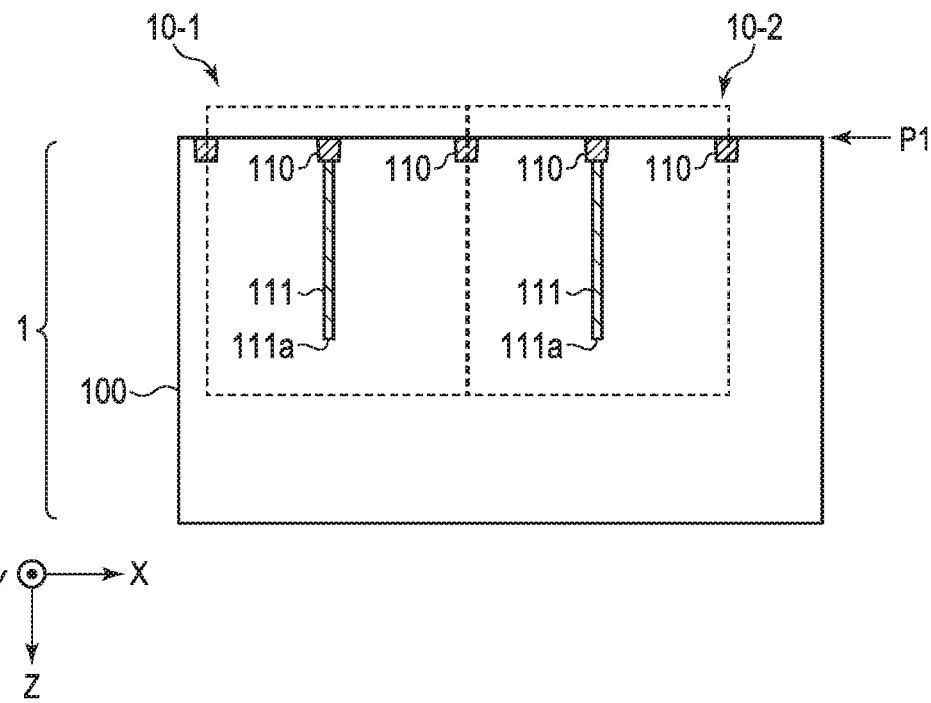
FIG. 5A is a diagram illustrating a manufacturing method of the photoelectric conversion device in the first embodiment of the present invention.

In FIG. 5A, the first trench 111 is formed on the front face P1 side of the substrate 100 formed of a silicon semiconductor. That is, a trench is formed by using a method such as photolithography and the Bosch process, film formation is performed on the trench by using a film formation method such as a CVD method, and a film outside a desired region is removed by using wet etching or the like. A material formed as a film on the trench may be an insulating film such as a silicon nitride film or a silicon oxide film.

Next, the isolation structure 110 that is shallower than the first trench 111 is formed on the front face P1 of the substrate 100 by shallow trench isolation (STI). The isolation structure 110 is formed between regions to be electrically isolated from each other such as between a plurality of transistors. Further, in plan view, the isolation structure 110 is formed to cover a part around the first trench 111. Thus, even when a level difference occurs in a trench by wet etching or the like after the first trench 111 is formed, the level difference can be covered by the isolation structure 110. Thus, in a step described later, a defect such as a formation failure of the gate electrodes T11g and T12g due to a level difference can be avoided.

Figure 5B:
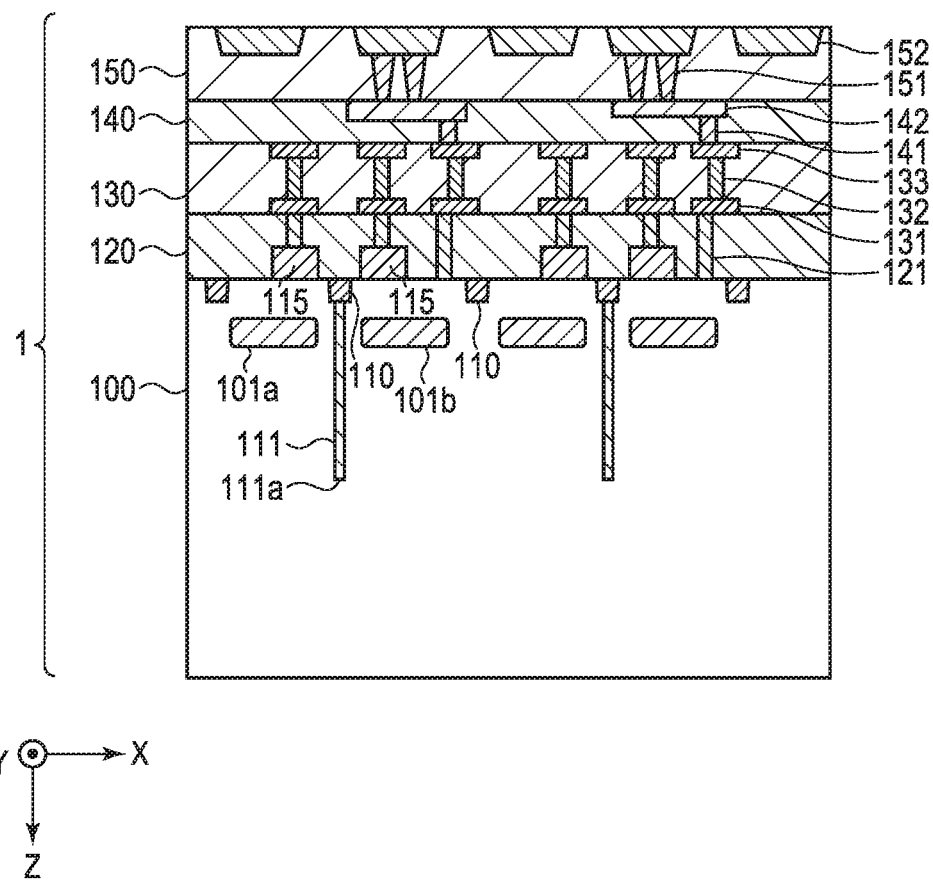
FIG. 5B is a diagram illustrating a manufacturing method of the photoelectric conversion device in the first embodiment of the present invention.

Next, as illustrated in FIG. 5B, the charge accumulation regions 101a and 101b are formed in the substrate 100. The charge accumulation regions 101a and 101b are formed in a region of a desired depth by an ion implantation method or the like. Further, various ion implantation methods are performed in order to control the potential of a pixel in the substrate 100.

Next, a gate electrode 115, an interlayer insulating film 120, a contact plug 121, and the like are formed in the substrate 100. The wiring 131 and the interlayer insulating film 130 are formed on the interlayer insulating film 120, and the via plug 132 and the wiring 133 are formed in the interlayer insulating film 130. Further, the interlayer insulating film 140 is formed on the interlayer insulating film 130, and the plug 141 and the wiring 142 are formed in the interlayer insulating film 140. Note that the number of wirings, the number of via plugs, and the number of interlayer insulating films are not limited to those in the example of FIG. 5B. The interlayer insulating film 150, the conductive member 151, and the bonding member 152 are formed on the interlayer insulating film 140.

Figure 5C:
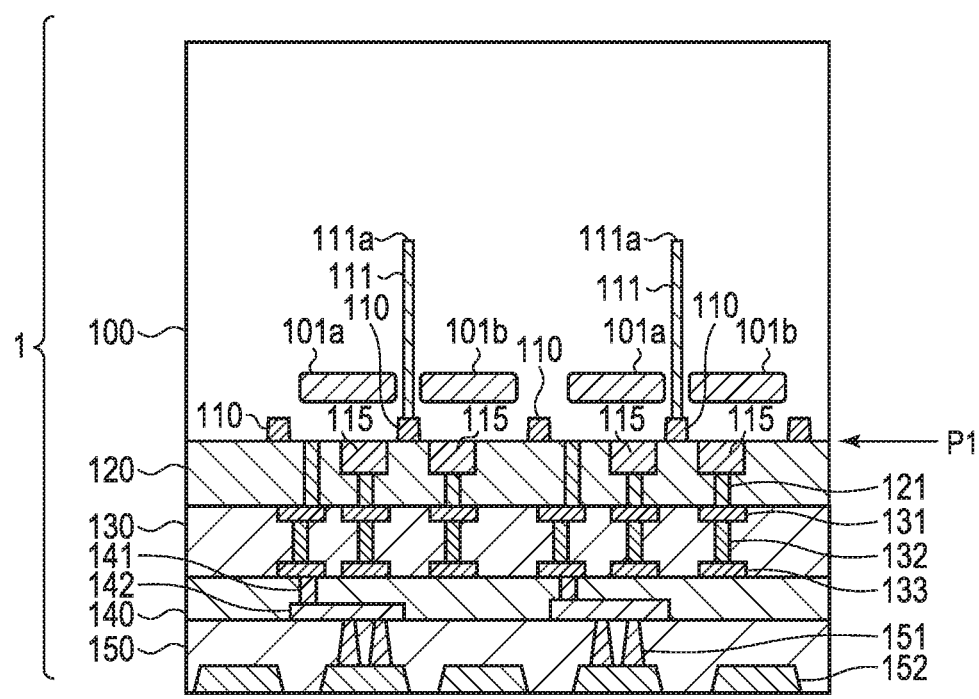
FIG. 5C is a diagram illustrating a manufacturing method of the photoelectric conversion device in the first embodiment of the present invention.
Figure 5C:
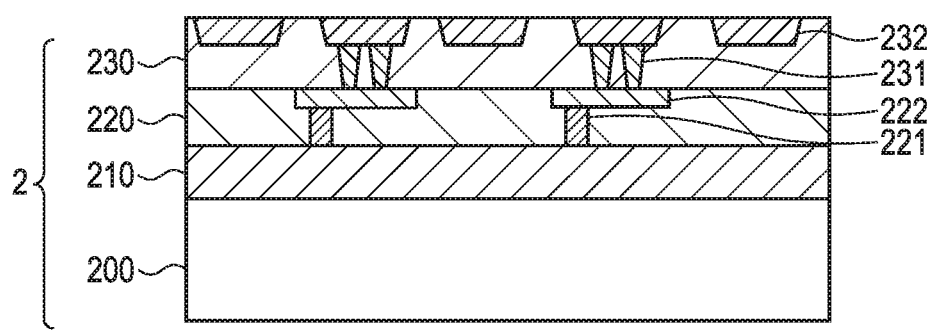
Figure 5C:
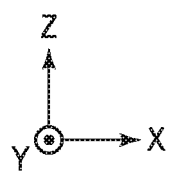
Figure 5D:
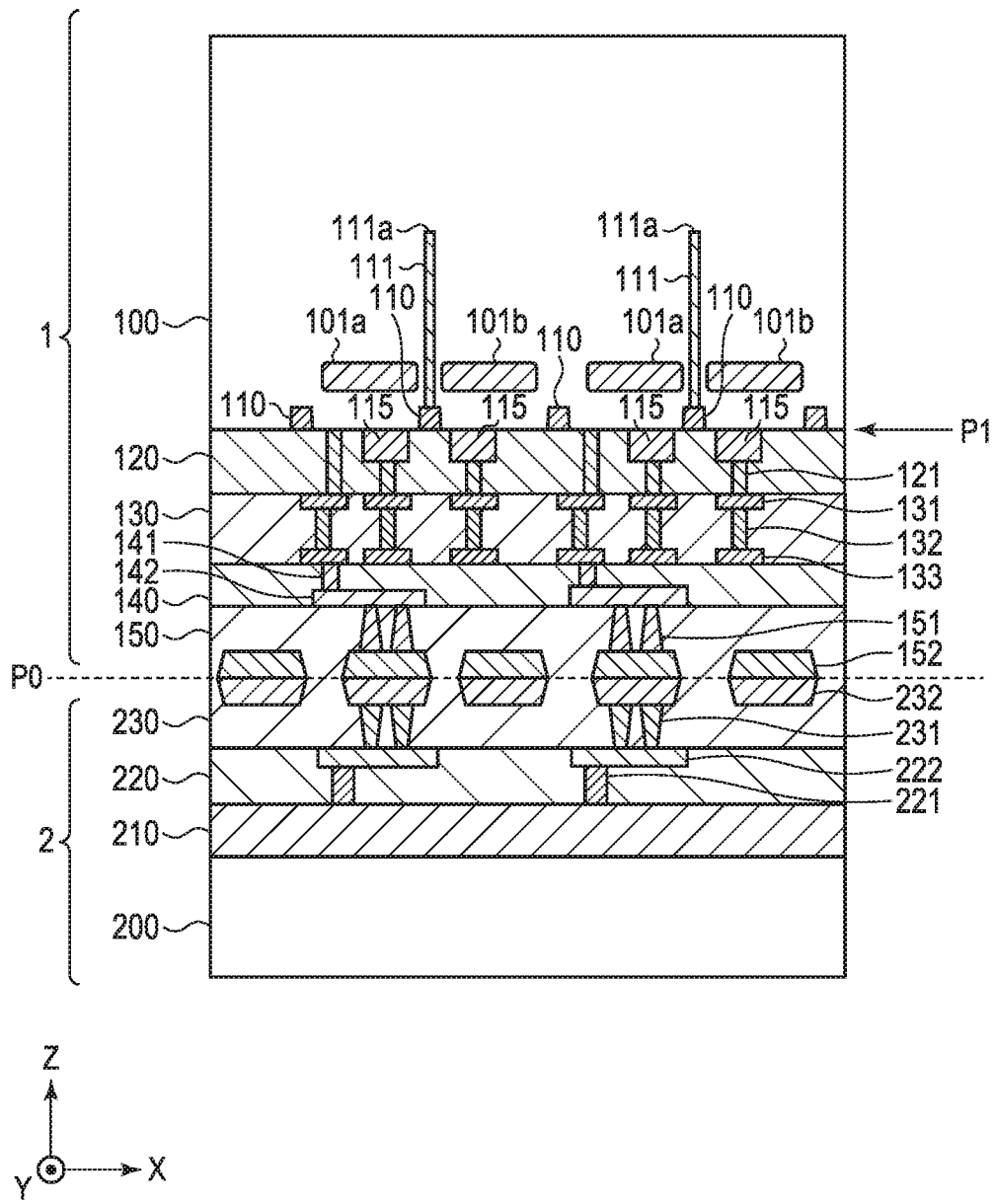
FIG. 5D is a diagram illustrating a manufacturing method of the photoelectric conversion device in the first embodiment of the present invention.

In the circuit element substrate 2 illustrated in FIG. 5C, an element function layer 210 is formed on the substrate 200 formed of a silicon semiconductor. A plurality of transistors, an isolation structure that electrically isolates the plurality of transistors from each other, and the like are formed in the element function layer 210. Next, the interlayer insulating film 220, the plug 221, and the wiring 222 are formed on the element function layer 210. Further, the interlayer insulating film 230, the conductive member 231, and a bonding member 233 are formed on the interlayer insulating film 220. For example, the wiring 222 is formed of Al, Cu, or the like, and the plug 221 may be formed of tungsten or the like, for example.

In FIG. 5C, the front and the back of the photoelectric conversion substrate 1 are inversed, and the face on which the bonding member 152 is formed is arranged facing the top face of the circuit element substrate 2. Next, in FIG. 5D, the photoelectric conversion substrate 1 and the circuit element substrate 2 are attached to each other, and the bonding member 152 of the photoelectric conversion substrate 1 and the bonding member 233 of the circuit element substrate 2 are connected to each other.

Figure 5E:
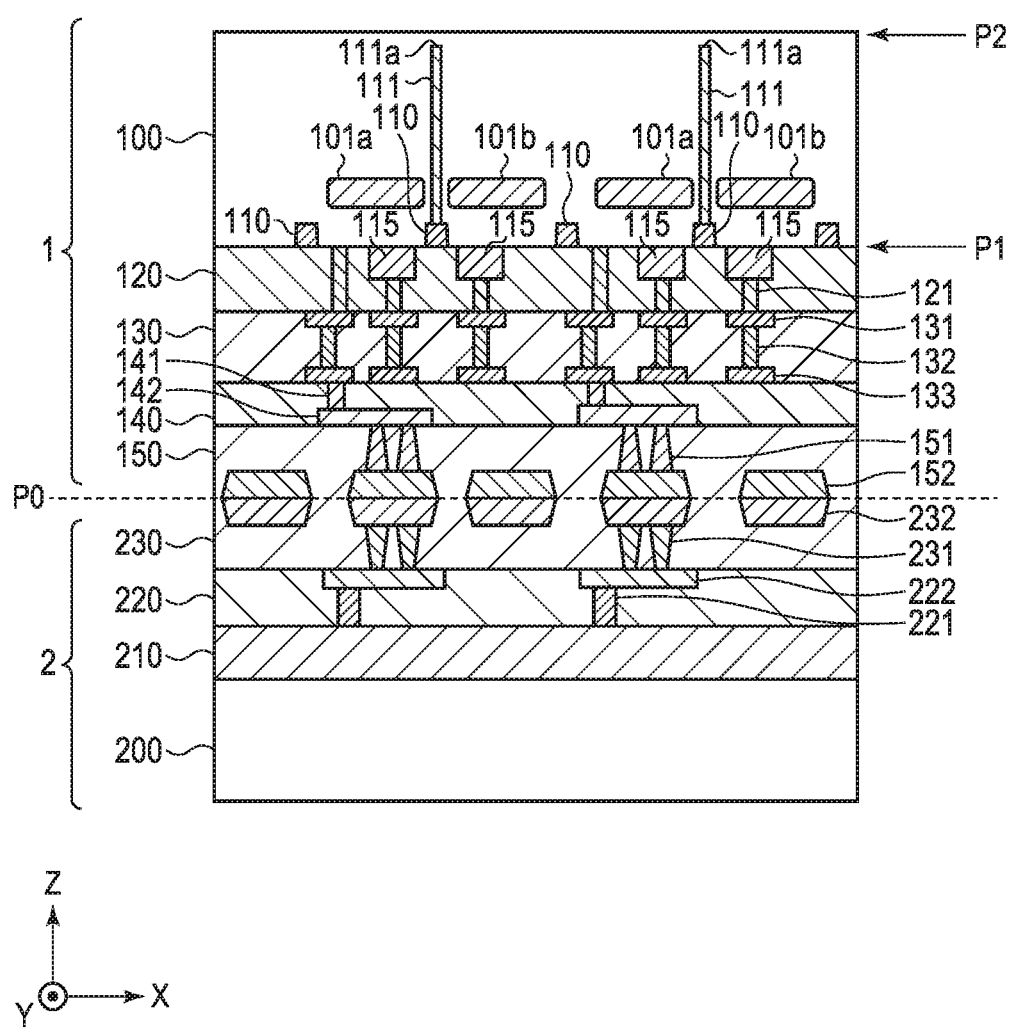
FIG. 5E is a diagram illustrating a manufacturing method of the photoelectric conversion device in the first embodiment of the present invention.

In FIG. 5E, a thinning process is performed on the back face P2 of the substrate 100 by grinding or the like, and the thickness of the substrate 100 becomes around 3.0 to 5.0 μm, for example. In the present embodiment, the end portion 111a of the first trench 111 is close to the back face P2 but does not reach the back face P2.

Figure 5F:
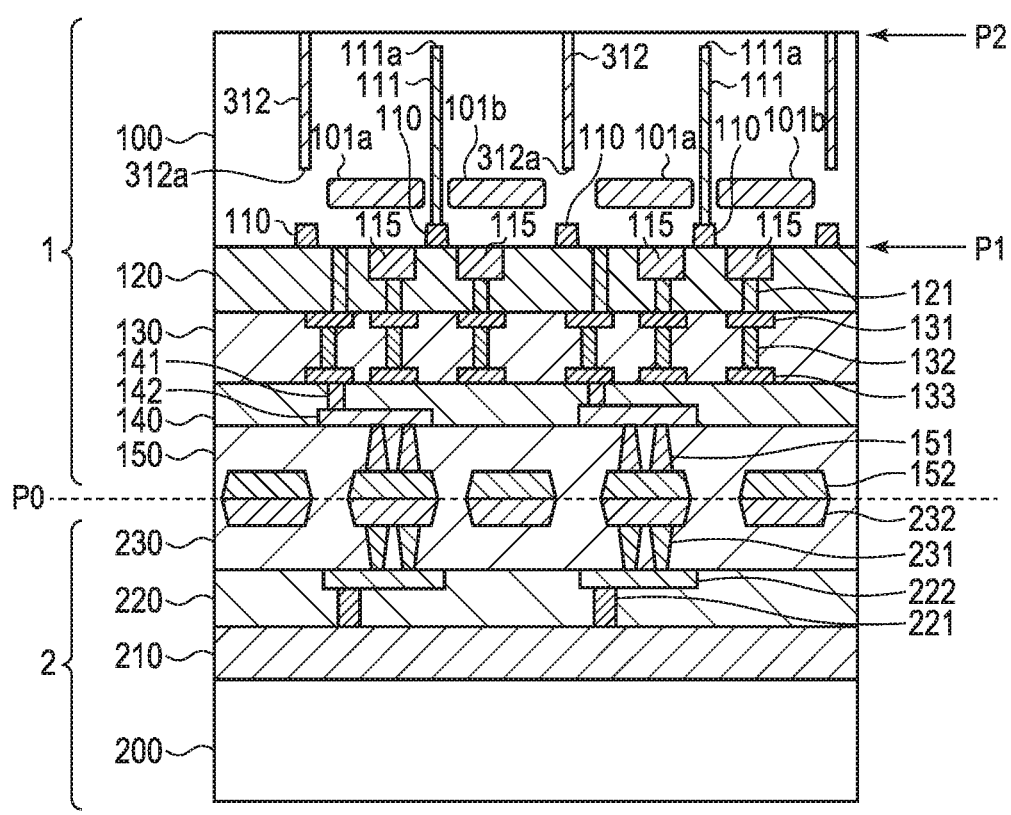
FIG. 5F is a diagram illustrating a manufacturing method of the photoelectric conversion device in the first embodiment of the present invention.

Next, in FIG. 5F, the second trench 312 is formed from the back face P2 side of the substrate 100 of the photoelectric conversion substrate 1. The second trench 312 is provided between the plurality of adjacent pixels 10 and suppresses crosstalk of the photoelectric conversion portions PD1 and PD2 between the plurality of adjacent pixels 10. The second trench 312 is formed by photolithography, the Bosch process, or the like and a metal oxide film may be formed on the side face of the second trench 312. It is preferable that the second trench 312 has a width of around 0.1 μm to 0.5 μm and a depth of around 1.0 to 3.0 μm.

Next, as illustrated in FIG. 4, an optical structure 3 including a metal oxide film 321, an antireflection film 322, an insulating film 323, a color filter 324, and a micro-lens 325 is formed on the back face P2 of the substrate 100. For example, the metal oxide film 321 is formed by using a material such as a hafnium oxide film or an aluminum oxide film by an atomic layer deposition (ALD) method or the like. By using the ALD method, uniformity of the metal oxide film formation can be improved in a trench having a large aspect ratio. For example, the antireflection film 322 may be formed by using a material such as a tantalum oxide film by an ALD method, a CVD method, or the like. The insulating film 323 is formed of a silicon oxide film, a silicon nitride film, a silicon oxynitride film, a carbon-contained silicon oxide film, a fluorine-contained silicon oxide film, or the like.

According to the present embodiment described above, by forming the first trench 111 from the front face P1 of the substrate 100 in the same manner as the photoelectric conversion portions PD1 and PD2, positioning accuracy of the first trench 111 with respect to the photoelectric conversion portions PD1 and PD2 can be improved. On the other hand, incident light can be efficiently blocked by forming the second trench 312 from the incident face side of the substrate 100 between the plurality of adjacent pixels 10. Further, layout flexibility of the isolation structure 110 or the gate electrodes on the front face P1 side of the substrate 100 can be improved by forming the second trench 312 from the incident face side of the substrate 100 so as not to reach the front face P1 of the substrate 100. Further, the end portion 111a of the first trench 111 extends closer to the back face P2 side of the substrate 100 than the end portion 312a of the second trench 312 and approaches a micro-lens 325. Thus, incident light can be efficiently blocked due to an increase in the incident light that can be blocked by the first trench 111, and crosstalk can be reduced. Therefore, according to the present embodiment, the first trench 111 is formed at high positioning accuracy for the photoelectric conversion portions PD1 and PD2, and incident light that can be blocked by the first trench 111 is increased. Thus, isolation performance can be improved.

Figure 6:
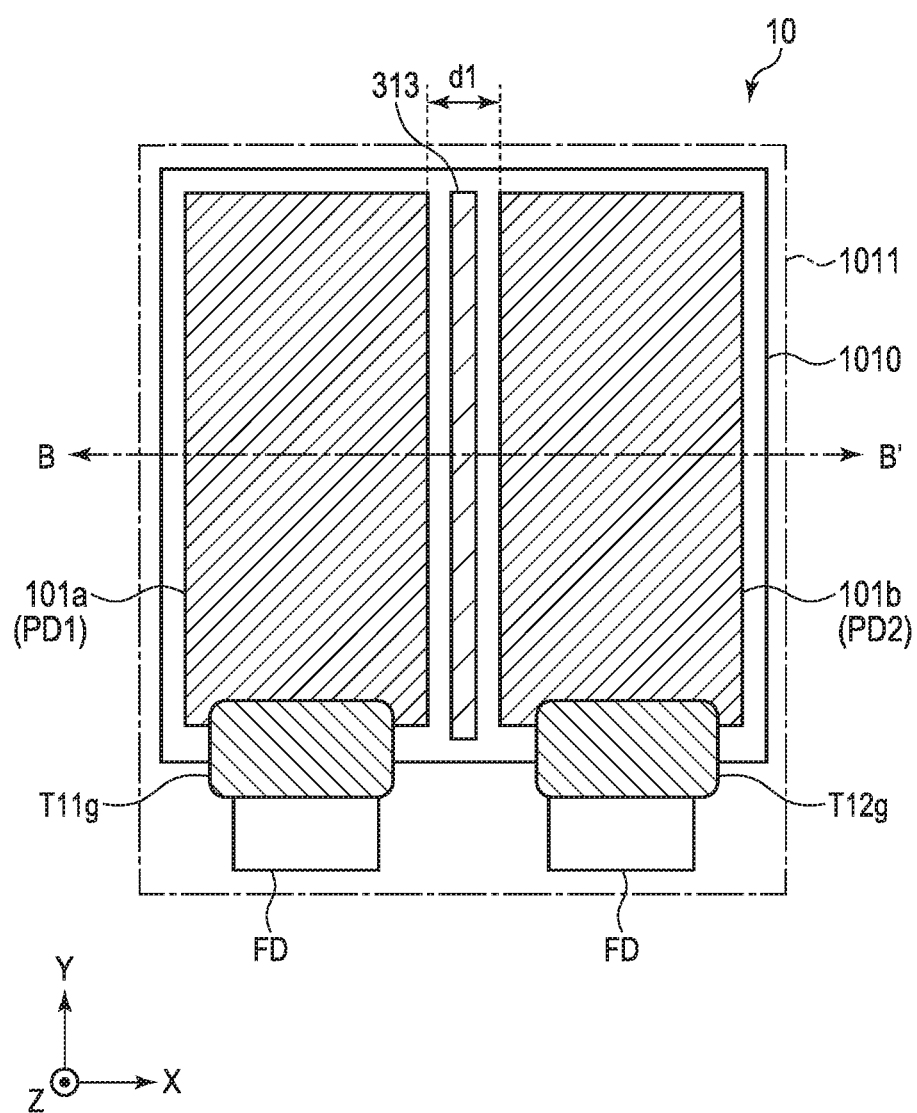
FIG. 6 is a plan view of a photoelectric conversion device in a first comparative example of the present invention.
Figure 7:
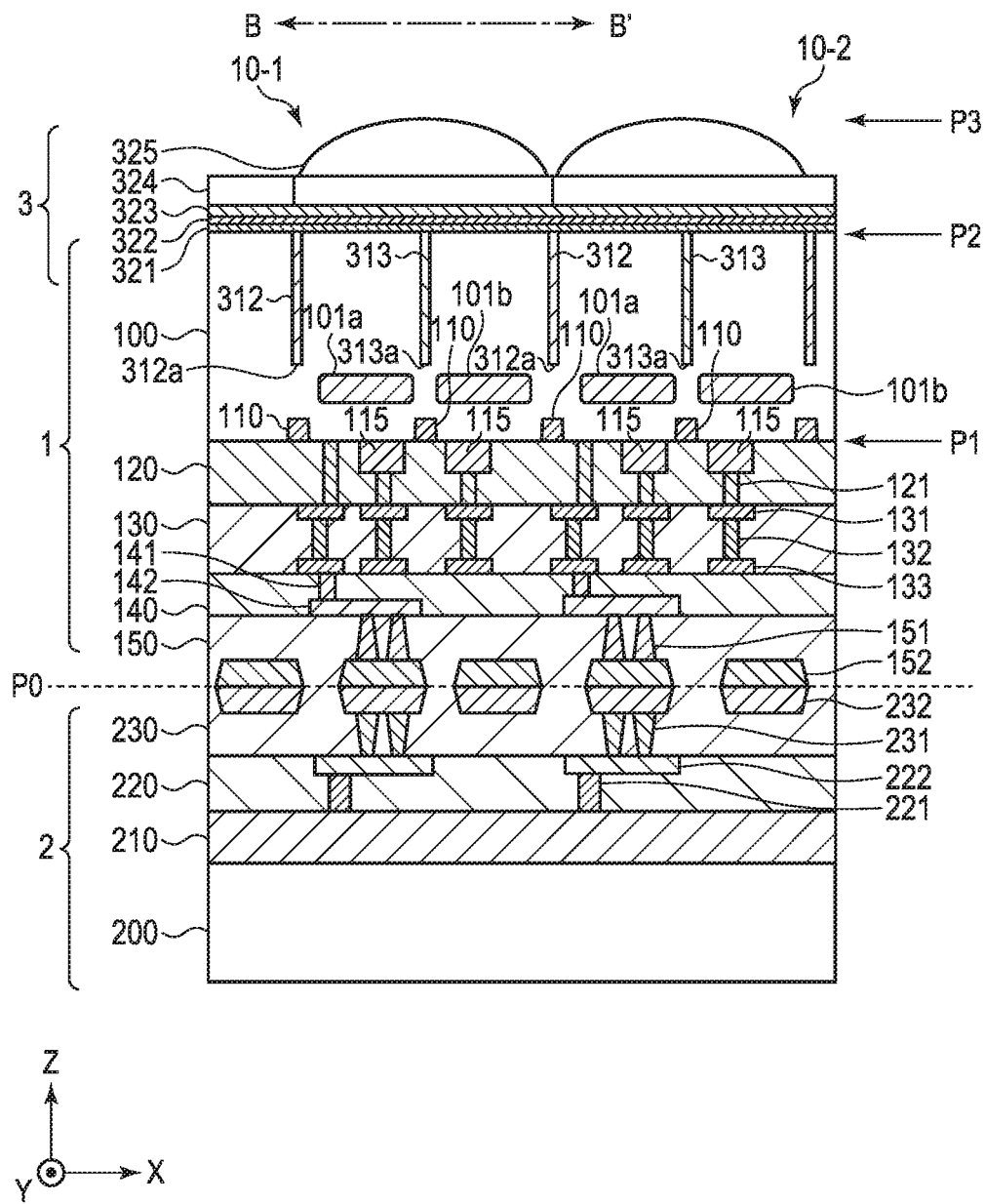
FIG. 7 is a sectional view of the photoelectric conversion device in the first comparative example.

The advantage of the present embodiment will be described below in detail in comparison with the photoelectric conversion device in the comparative example. FIG. 6 is a plan view of the photoelectric conversion device in the first comparative example. FIG. 7 is a sectional view of a photoelectric conversion device in the first comparative example and is a sectional view taken along a line B-B' of FIG. 6. Features different from those of the present embodiment will be mainly described, and the same features as those of the present embodiment are labeled with the same references.

In the comparative example, instead of the first trench 111 in the present embodiment, the third trench 313 extends in a direction (−Z direction) from the back face P2 side of the substrate 100 to the inside of the substrate 100. The depth of the third trench 313 in the substrate 100 is substantially the same as the depth of the second trench 312. The third trench 313 is arranged between the charge accumulation regions 101*a* and 101*b* in plan view. Further, while the end portion 313*a* of the third trench 313 is located closer to the back face P2 side than the charge accumulation regions 101*a* and 101*b*, the end portion 313*a* may extend closer to the front face P1 side than the charge accumulation regions 101*a* and 101*b*. The isolation structure 110 may be arranged at a position of the front face P1 corresponding to the end portion 313*a*.

The manufacturing method of the photoelectric conversion device in the comparative example is substantially the same as the manufacturing method in the first embodiment except for the step of forming the third trench 313. That is, after the step of forming the substrate 100 to be thin (see FIG. 5F) and before the film forming step of the metal oxide film 321, the third trench 313 may be formed in the same manner as the second trench 312.

Figure 8:
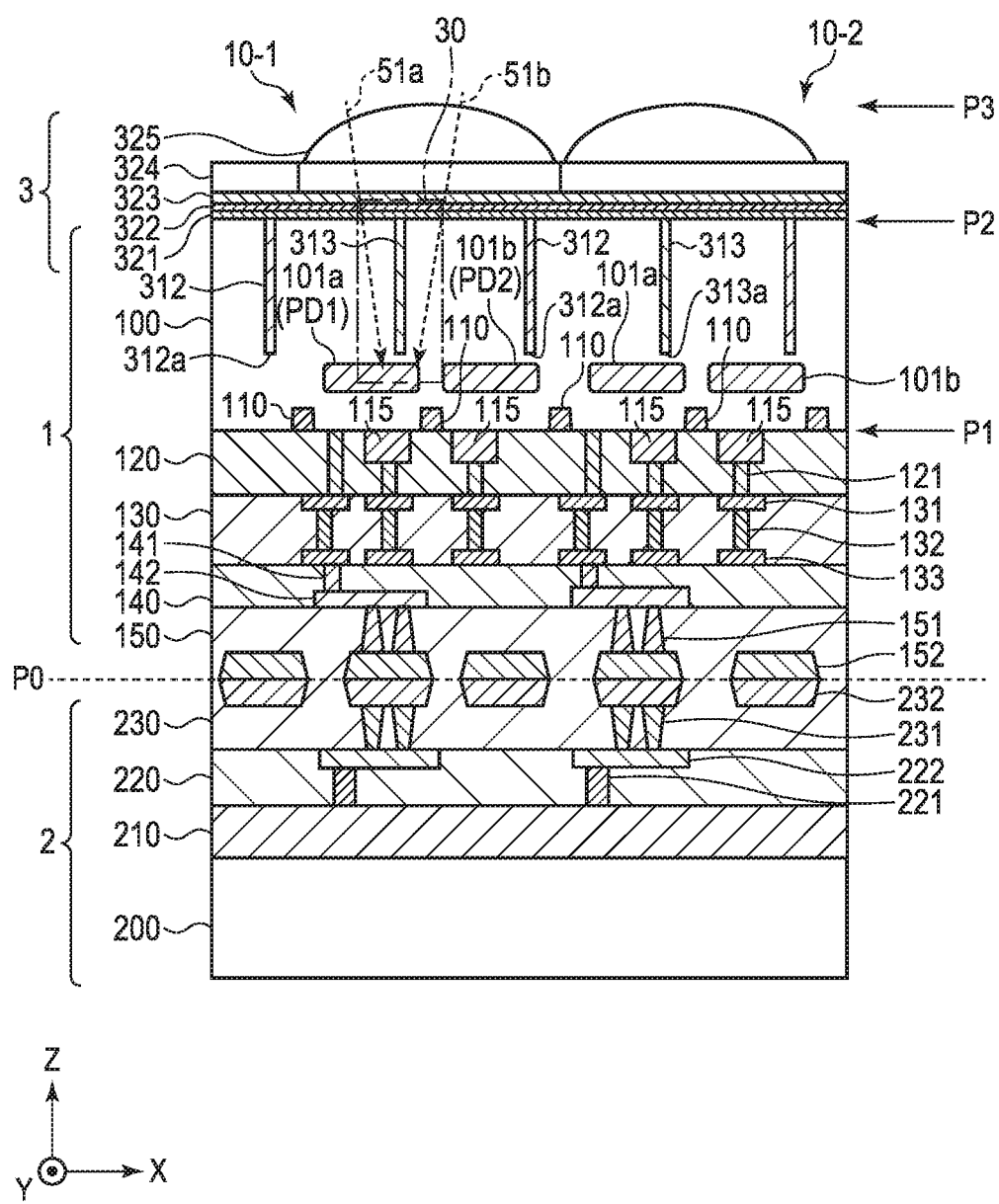
FIG. 8 is a sectional view of the photoelectric conversion device in the first comparative example.

FIG. 8 is a sectional view of the photoelectric conversion device in the first comparative example and illustrates a path of incident light when the position of the third trench 313 is shifted.

When the photoelectric conversion substrate 1 and the circuit element substrate 2 are attached to each other, non-linear distortion may occur in the photoelectric conversion substrate 1 or the circuit element substrate 2. Thus, when a resist is applied on the substrate 100 of the photoelectric conversion substrate 1, and patterning is performed with a photolithography method after the attachment, the opening position of the resist for forming the second trench 312 and the third trench 313 may be shifted with respect to the pixel 10. While the second trench 312 and the third trench 313 are to be formed between the charge accumulation regions 101*a* and 101*b*, the second trench 312 and the third trench 313 are formed shifted to the charge accumulation region 101*a* side (X direction) in FIG. 8. That is, the isolation structure 30 in the pixel 10-1 is offset to the charge accumulation region 101*a* side. Thus, a part of the incident light 51*b* from the right side of the micro-lens 325 is not blocked by the third trench 313 and enters the photoelectric conversion portion PD1 on the left side, and signal charges corresponding to the incident light 51*b* are accumulated in the charge accumulation region 101*a*. That is, in the charge accumulation region 101*a*, not only signal charges corresponding to the incident light 51*a* on the left side of the trench but also signal charges corresponding to the incident light 51*b* are accumulated. As a result, crosstalk between the photoelectric conversion portions PD1 and PD2 occurs. Such crosstalk causes a problem such as deterioration of automatic focusing accuracy.

Figure 9:
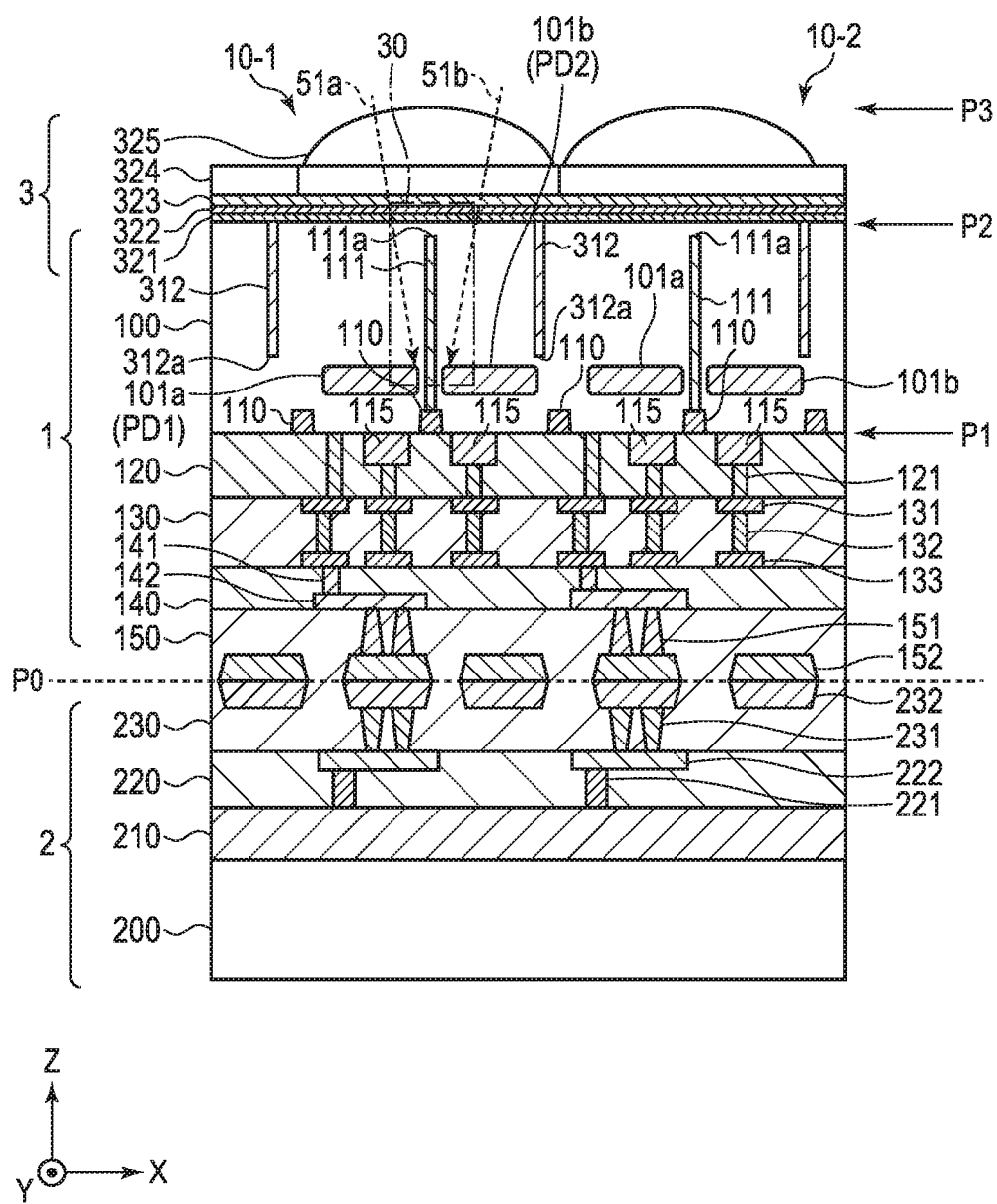
FIG. 9 is a sectional view of the photoelectric conversion device in the first embodiment of the present invention.

FIG. 9 is a sectional view of the photoelectric conversion device in the present embodiment and illustrates a state in which nonlinear distortion is caused due to attachment of the photoelectric conversion substrate 1. In a similar manner to the comparative example of FIG. 8, the second trench 312 is formed in a position shifted from the boundary position of the pixel 10. On the other hand, the first trench 111 is formed from the front face P1 side of the substrate 100 before the step in which the photoelectric conversion substrate 1 and the circuit element substrate 2 are attached to each other (FIG. 5A). Thus, the first trench 111 is not affected by the nonlinear distortion due to the attachment of the photoelectric conversion substrate 1 and is formed at high accuracy between the charge accumulation regions 101*a* and 101*b*. As illustrated in FIG. 9, in the isolation structure 30 in the pixel 10-1, the incident light 51*b* on the right side of the first trench 111 enters the photoelectric conversion portion PD2 on the right side. The incident light 51*b* traveling to the photoelectric conversion portion PD1 on the left side is blocked by the first trench 111, does not enter the photoelectric conversion portion PD1, is reflected by the first trench 111, and enters the photoelectric conversion portion PD2. Similarly, the incident light 51*a* on the left side of the first trench 111 enters the photoelectric conversion portion PD1 on the left side. The incident light 51*a* traveling to the photoelectric conversion portion PD2 on the right side is blocked by the first trench 111, does not enter the photoelectric conversion portion PD2, is reflected by the first trench 111, and enters the photoelectric conversion portion PD1. As a result, crosstalk between the photoelectric conversion portions PD1 and PD2 can be suppressed.

Further, in the present embodiment, the first trench 111 extends from the front face P1 of the substrate 100 to a part near the back face P2 of the substrate 100 through a part between the photoelectric conversion portions PD1 and PD2. Thus, the first trench 111 can isolate incident light near the photoelectric conversion portions PD1 and PD2 and can isolate incident light on the incident face side. On the other hand, by forming the second trench 312 from the incident face side of the substrate 100 between the plurality of adjacent pixels 10, incident light can be efficiently blocked. Further, the end portion 312*a* of the second trench 312 may be located closer to the back face P2 side than the charge accumulation regions 101*a* and 101*b*, and the end portion 312*a* may extend closer to the front face P1 side than the charge accumulation regions 101*a* and 101*b*. When the end portion 312*a* of the second trench 312 is located closer to the back face P2 side than the charge accumulation regions 101*a* and 101*b*, the second trench 312 does not interfere with the charge accumulation regions 101*a* and 101*b* even when the position of the second trench 312 is shifted.

Since the first trench 111 is formed from the front face P1 side of the substrate 100, the number of heating steps after trench formation is performed is larger, and the maximum temperature of the heating step is higher compared to the case of the manufacturing method of the photoelectric conversion device of the comparative example. Thus, in the present embodiment, recovery from a defect or an interface level that occurs during formation of a trench is facilitated in the heating step, and dark current due to the defect or the interface level can be reduced.

Note that, in addition to the first trench 111 and the second trench 312 that are physical trenches, an isolation structure may be formed by ion implantation. While the isolation performance caused by a physical trench is higher than the isolation performance caused by the ion implantation, isolation performance can be further improved by using the isolation structure caused by ion implantation in combination.

Further, the gate electrodes T11*g* and T12*g* are formed spaced apart from the isolation structure 110 at the distance d2 in plan view. Thus, the gate electrodes T11*g* and T12*g* can avoid a defect due to a level difference of the isolation structure 110. As described in detail above, according to the present embodiment, isolation performance can be improved.

Second Embodiment

Figure 10:
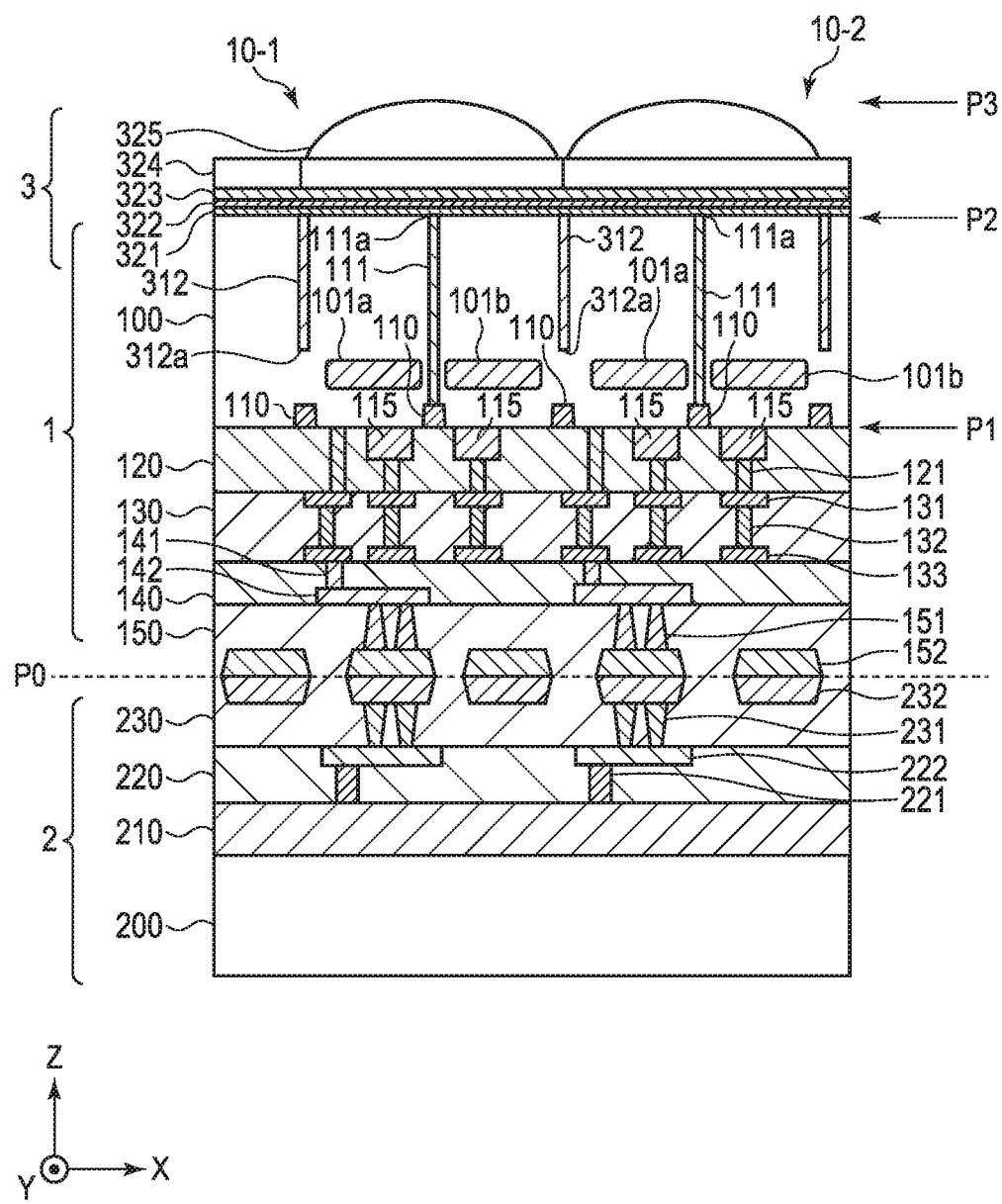
FIG. 10 is a sectional view of a photoelectric conversion device in a second embodiment of the present invention.

FIG. 10 is a sectional view of a photoelectric conversion device in the present embodiment. Features different from those of the photoelectric conversion device in the first embodiment will be mainly described below.

In the present embodiment, the first trench 111 reaches the back face P2 of the substrate 100 from the front face P1. Compared to the first embodiment, since the end portion 111a of the first trench 111 is much closer to the micro-lens 325, the isolation performance of incident light can be further improved, and crosstalk can be efficiently reduced. Further, even with occurrence of variation in etching depth during formation of the first trench 111 or variation in thickness of the substrate 100 in thinning the substrate after attachment, the position of the end portion 111a with respect to the back face P2 is not affected. Thus, variation in characteristics for respective pixels can be reduced.

The manufacturing method of the photoelectric conversion device in the present embodiment is substantially the same as the case of the first embodiment but is different from the case of the first embodiment in the step of thinning the semiconductor substrate illustrated in FIG. 5E. The thinning process is performed on the back face P2 of the substrate 100 by grinding or the like, and the end portion 111a of the first trench 111 is exposed in the back face P2. Accordingly, the first trench 111 penetrates the substrate 100 from the front face P1 to the back face P2. The subsequent steps are the same as those of the first embodiment.

Also in the present embodiment, in the same manner as the first embodiment, by forming the first trench 111 from the front face P1 of the substrate 100 in the same manner as the photoelectric conversion portions PD1 and PD2, a position shift of the first trench 111 with respect to the photoelectric conversion portions PD1 and PD2 can be reduced. Further, since the end portion 111a of the first trench 111 reaches the back face P2 of the substrate 100, incident light can be efficiently blocked. Accordingly, also in the present embodiment, isolation performance can be improved.

Third Embodiment

Figure 11:
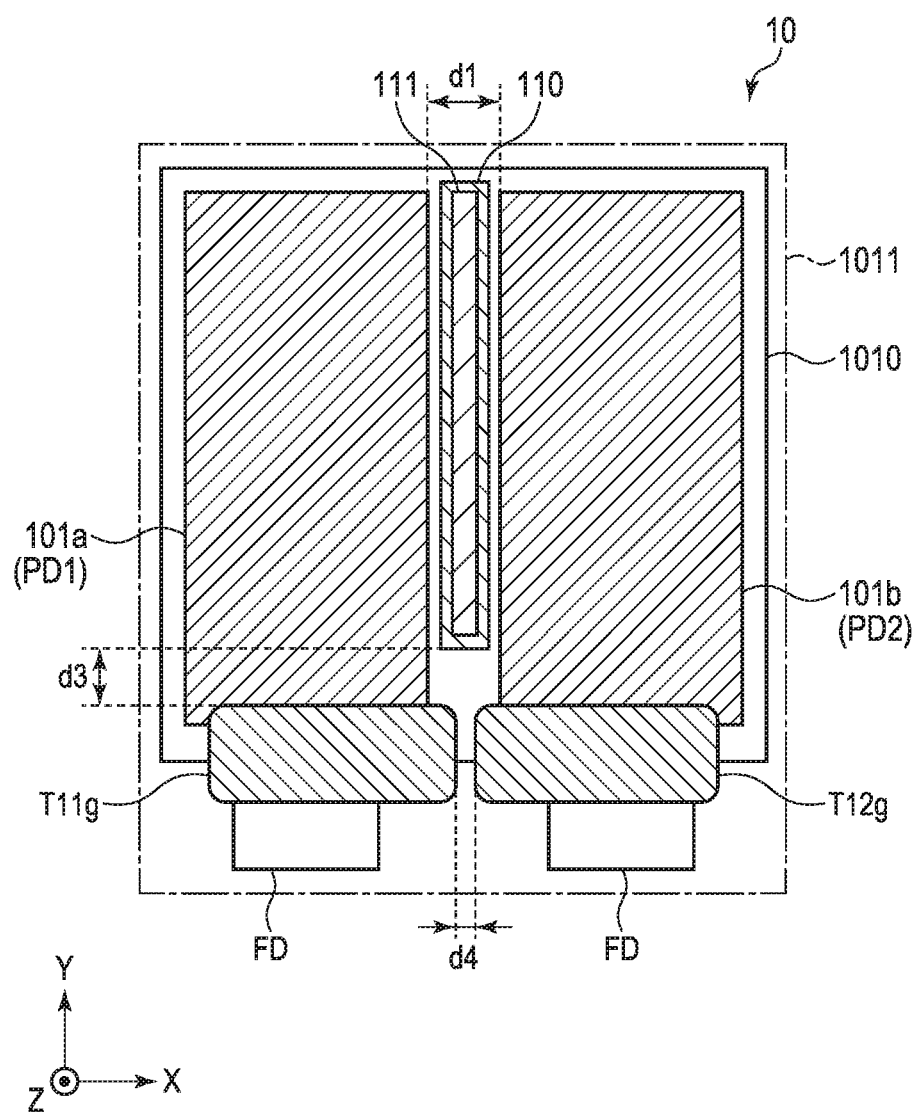
FIG. 11 is a plan view of a photoelectric conversion device in a third embodiment of the present invention.

FIG. 11 is a plan view of a photoelectric conversion device in the present embodiment and illustrates a part of the pixel 10. Features different from the photoelectric conversion device of the first embodiment will be mainly described below.

In plan view, a distance d4 between the gate electrodes T11g and T12g is narrower than the distance d1 between the charge accumulation regions 101a and 101b, and the isolation structure 110 is not arranged between the gate electrodes T11g and T12g. The isolation structure 110 is formed spaced apart from the gate electrodes T11g and T12g in the Y direction at a distance d3. Thus, the gate electrodes T11g and T12g can avoid a defect due to a level difference of the isolation structure 110. While the isolation structure 110 is arranged between the gate electrodes T11g and T12g in plan view in the first embodiment, the isolation structure 110 is not arranged between the gate electrodes T11g and T12g in the present embodiment. It is possible to increase the transfer efficiency by increasing the X direction length of the gate electrodes T11g and T12g, that is, the channel width.

Figure 12:
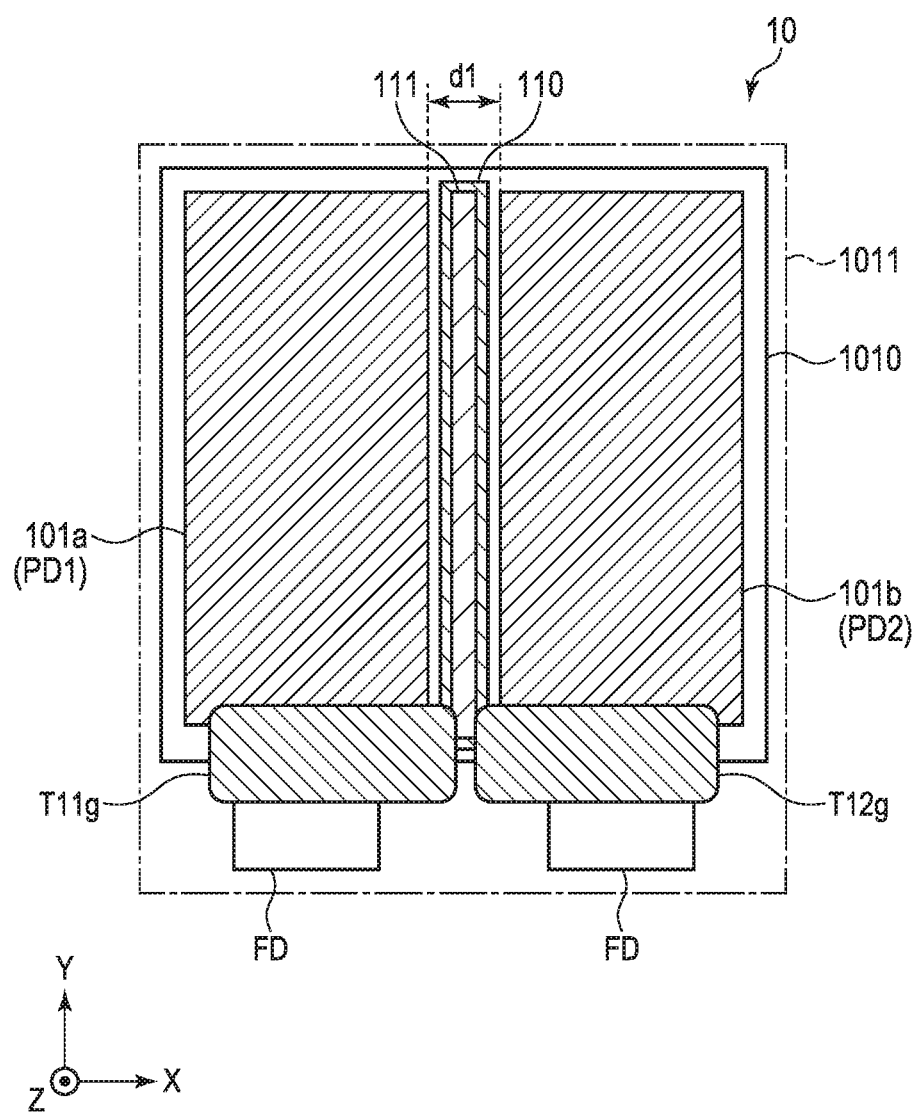
FIG. 12 is a plan view of a photoelectric conversion device in a second comparative example.

FIG. 12 is a plan view of a photoelectric conversion device in the second comparative example and illustrates a part of the pixel 10. The length of the gate electrodes T11g and T12g in the X direction in the second comparative example is substantially the same as that of FIG. 11. On the other hand, the isolation structure 110 is not spaced apart from the gate electrodes T11g and T12g in the Y direction, and the isolation structure 110 and the gate electrodes T11g and T12g are arranged to overlap each other in plan view. In the comparative example, when a pattern corresponding to the gate electrodes T11g and T12g is exposed to a resist (not illustrated) by using a photolithography method, a level difference of the isolation structure 110 may cause a focus shift at a position where the isolation structure 110 and the gate electrodes T11g and T12g overlap each other. The focus shift may cause a short-circuit of the gate electrodes T11g and T12g, for example. Further, due to the level difference of the isolation structure 110, the gate electrodes T11g and T12g may be discontinuous at the position where the isolation structure 110 and the gate electrodes T11g and T12g overlap each other.

In contrast, according to the present embodiment illustrated in FIG. 11, the isolation structure 110 is formed spaced apart from the gate electrodes T11g and T12g at the distance d3 in the Y direction in plan view. Thus, a formation failure of the gate electrodes T11g and T12g due to a level difference of the isolation structure 110 described above can be suppressed.

Fourth Embodiment

Figure 13:
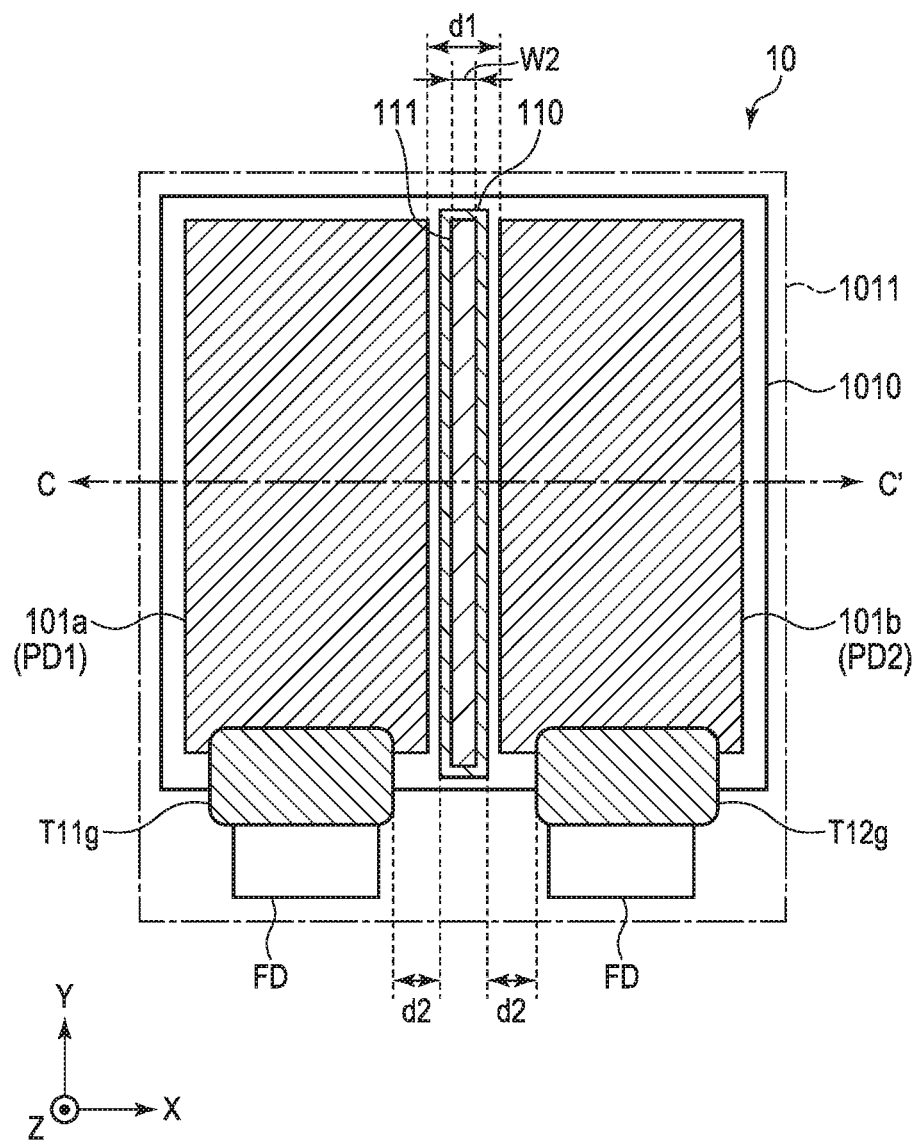
FIG. 13 is a plan view of a photoelectric conversion device in a fourth embodiment of the present invention.
Figure 14:
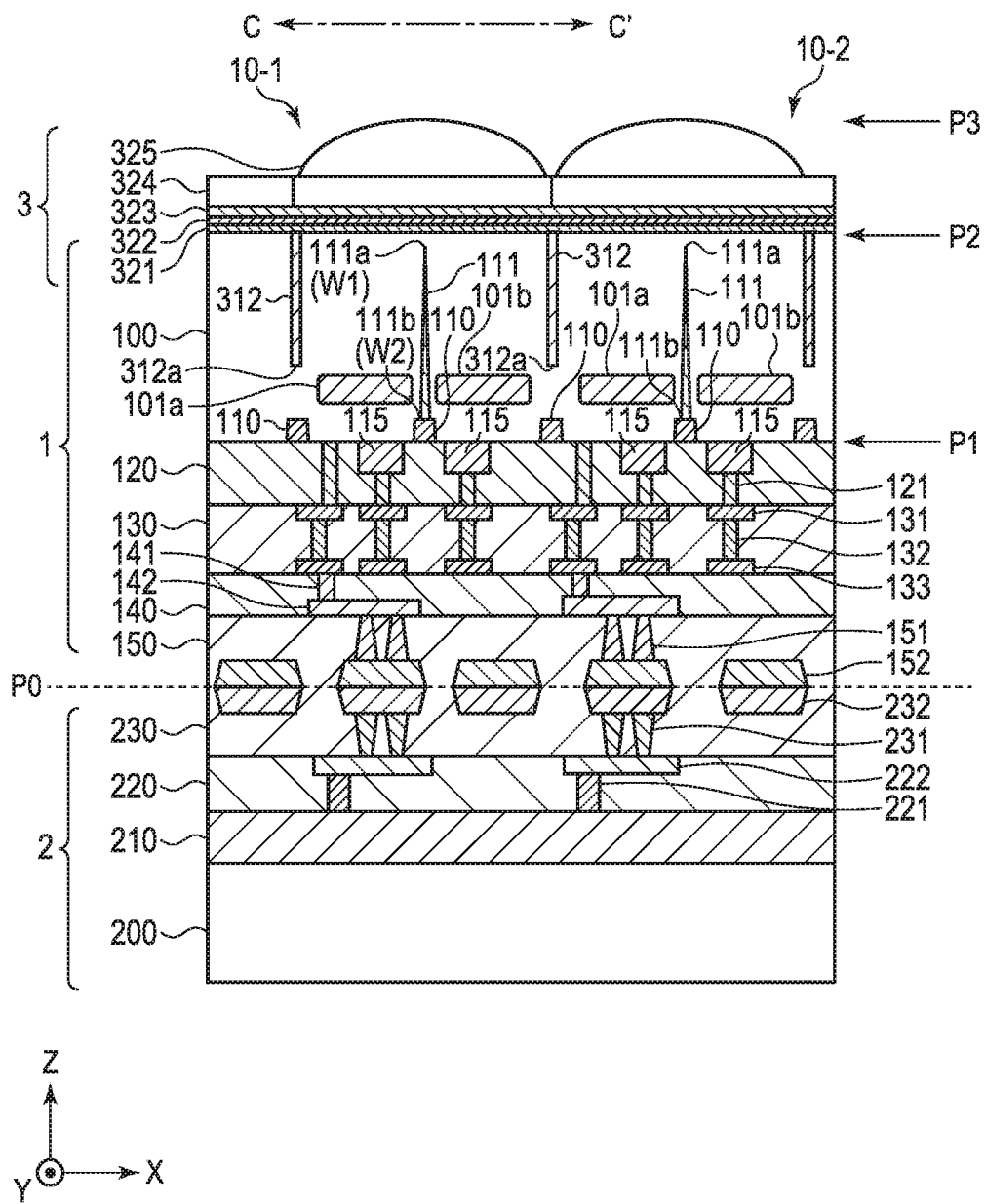
FIG. 14 is a sectional view of the photoelectric conversion device in the fourth embodiment of the present invention.

Next, a photoelectric conversion device in the present embodiment will be described. FIG. 13 is a plan view of the photoelectric conversion device in the present embodiment and illustrates a part of the pixel 10. Further, FIG. 14 is a sectional view of the photoelectric conversion device in the present embodiment and is a sectional view taken along a line C-C' of FIG. 13. Features different from those of the first embodiment will be mainly described below.

In the present embodiment, the width (first width) W1 on the end portion 111a side of the first trench 111 in the X direction is narrower than the width (second width) W2 on the front face P1 side in the X direction. That is, the first trench 111 has a portion of the width W1 and a portion of the width W2 in a cross section along the X direction, and the portion of the width W1 is closer to the back face P2 than the portion of the width W2. Further, a cross section of the end portion 111a of the first trench 111 is formed in a tapered shape. That is, the width of the first trench 111 in the direction crossing the charge accumulation regions 101a and 101b is formed so as to be gradually narrower from the front face P1 side to the end portion 111a side.

The manufacturing method of the photoelectric conversion device in the present embodiment is substantially the same as the manufacturing method in the first embodiment except for the first trench 111. In the step illustrated in FIG. 5A, the first trench 111 can be formed in a tapered shape by adjusting a time ratio of film formation and etching by the Bosch method, for example, when performing etching after the photolithography step. That is, the step of film formation of a polymer on the inner wall of the first trench 111 and the step of etching and removing the polymer on the bottom face (end portion 111a) of the first trench 111 and etching Si of the substrate 100 are repeated at a predetermined time ratio. Thereby, the first trench can be formed at a high aspect ratio, and the end portion can be formed in a tapered shape. As a polymer formed as a film on the inner wall of the first trench 111, a CF-based polymer may be used.

Further, as illustrated in FIG. 5A, the first trench 111 is formed before the photoelectric conversion substrate 1 and the circuit element substrate 2 are attached to each other. Thus, in the same manner as the first embodiment, the first trench 111 is not affected by nonlinear distortion due to the attachment of the photoelectric conversion substrate 1 and may be formed at high accuracy between the charge accumulation regions 101a and 101b.

By forming the end portion 111a on the light incident face side of the first trench 111, that is, on the back face P2 side to be thinner, it is possible to reduce reflected light of the end portion 111a. Thus, according to the present embodiment, crosstalk between the photoelectric conversion portions PD1 and PD2 in the pixel 10 can be efficiently suppressed.

Further, the width W1 on the back face P2 side is formed so as to be narrower than the width W2 on the front face P1 side of the first trench 111. That is, the fineness on the back face P2 side is higher than the fineness on the front face P1 side of the first trench 111. In the present embodiment, by forming the first trench 111 from the front face P1 side, a much finer resist opening formed by photolithography can be formed by etching. Thus, the end portion 111a can be formed finely on the light incident face P3 side, that is, on the back face P2 side. On the other hand, as with the comparative example of FIG. 7, in a case where the first trench 111 is formed from the back face P2 side, that is, in a case of the third trench 313, it is difficult to form, by etching, a much finer resist opening formed by lithography on the back face P2 side. That is, in the comparative example of FIG. 7, it is difficult to form a fine trench between the photoelectric conversion portions PD1 and PD2 on the back face P2 side.

Further, in the same manner as the first embodiment, the end portion 111a of the first trench 111 is located closer to the back face P2 than the end portion 312a of the second trench 312 formed between the plurality of pixels 10. Thus, since the end portion 111a of the first trench 111 is closer to the micro-lens 325, isolation performance can be improved. Thus, incident light can be isolated near the back face P2 away from the charge accumulation regions 101a and 101b, and isolation performance can be improved.

Further, as illustrated in FIG. 13, the isolation structure 110 is formed spaced apart from the gate electrodes T11g and T12g in the X direction at the distance d2 in plan view. That is, a part of the isolation structure 110 is arranged between the gate electrodes T11g and T12g and spaced apart from the gate electrodes T11g and T12g at the distance d2. Thus, a formation failure of the gate electrodes T11g and T12g due to a level difference of the isolation structure 110 can be avoided.

Also in the present embodiment, the position shift of the first trench 111 can be reduced, and isolation performance can be improved. Further, by forming the first trench 111 in a tapered shape, reflected light can be reduced, and crosstalk can be efficiently suppressed.

Fifth Embodiment

Figure 15:
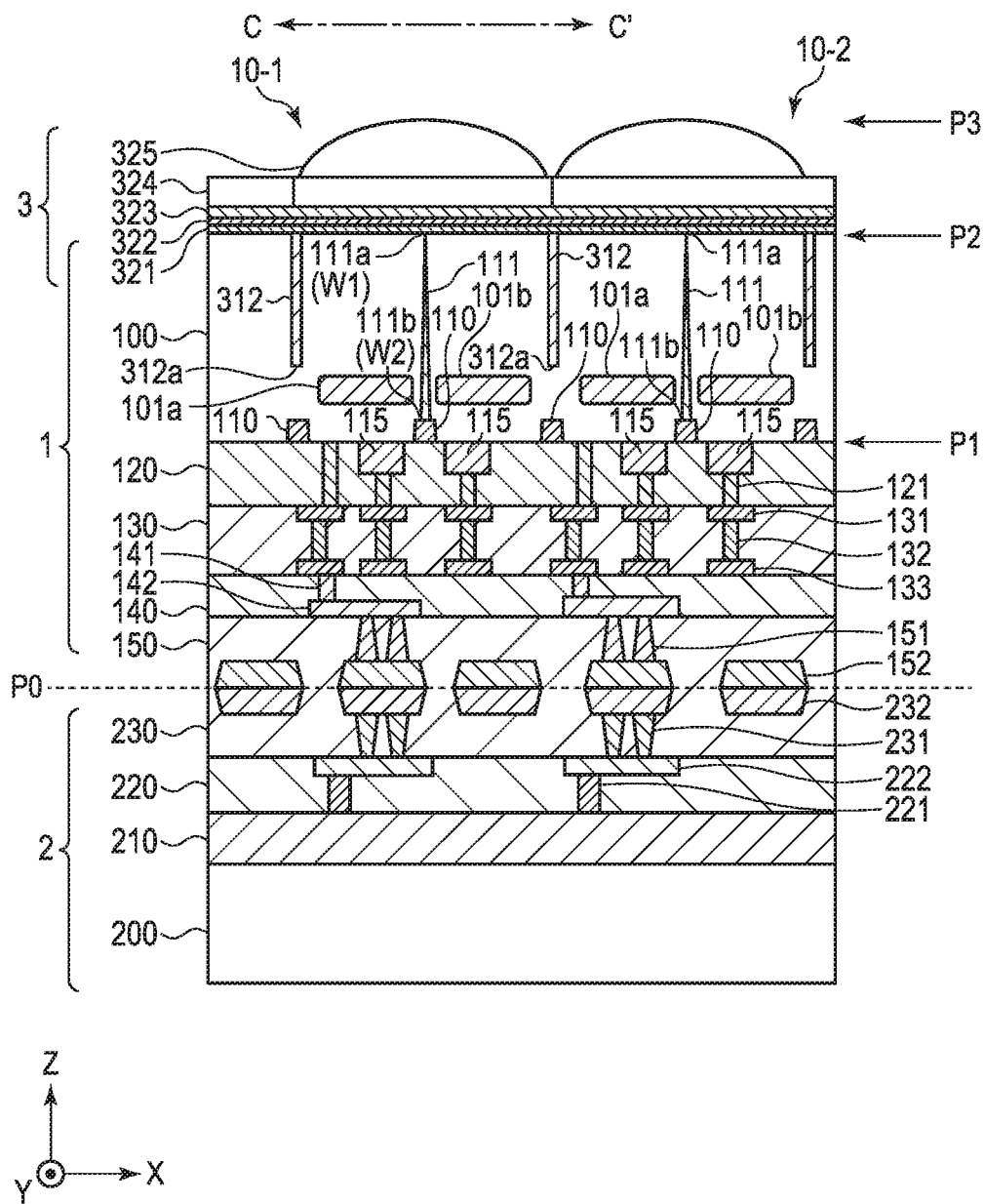
FIG. 15 is a sectional view of a photoelectric conversion device in a fifth embodiment of the present invention.

Next, a photoelectric conversion device in the present embodiment will be described. FIG. 15 is a sectional view of the photoelectric conversion device in the present embodiment and is a sectional view taken along a line C-C' of FIG. 13. Features different from those of the fourth embodiment will be mainly described below.

In the present embodiment, the end portion 111a of the first trench 111 reaches the back face P2. Since the end portion 111a of the first trench 111 is much closer to the micro-lens 325 compared to the fourth embodiment, the isolation performance of incident light can be further improved. Further, even with occurrence of variation in depths of the etching during formation of the first trench 111 or variation in thicknesses of the substrate 100 in thinning the substrate after attachment, the advantage that the position of the end portion 111a with respect to the back face P2 is not affected is obtained. Thus, variation in characteristics for each pixel can be reduced.

Sixth Embodiment

Figure 16:
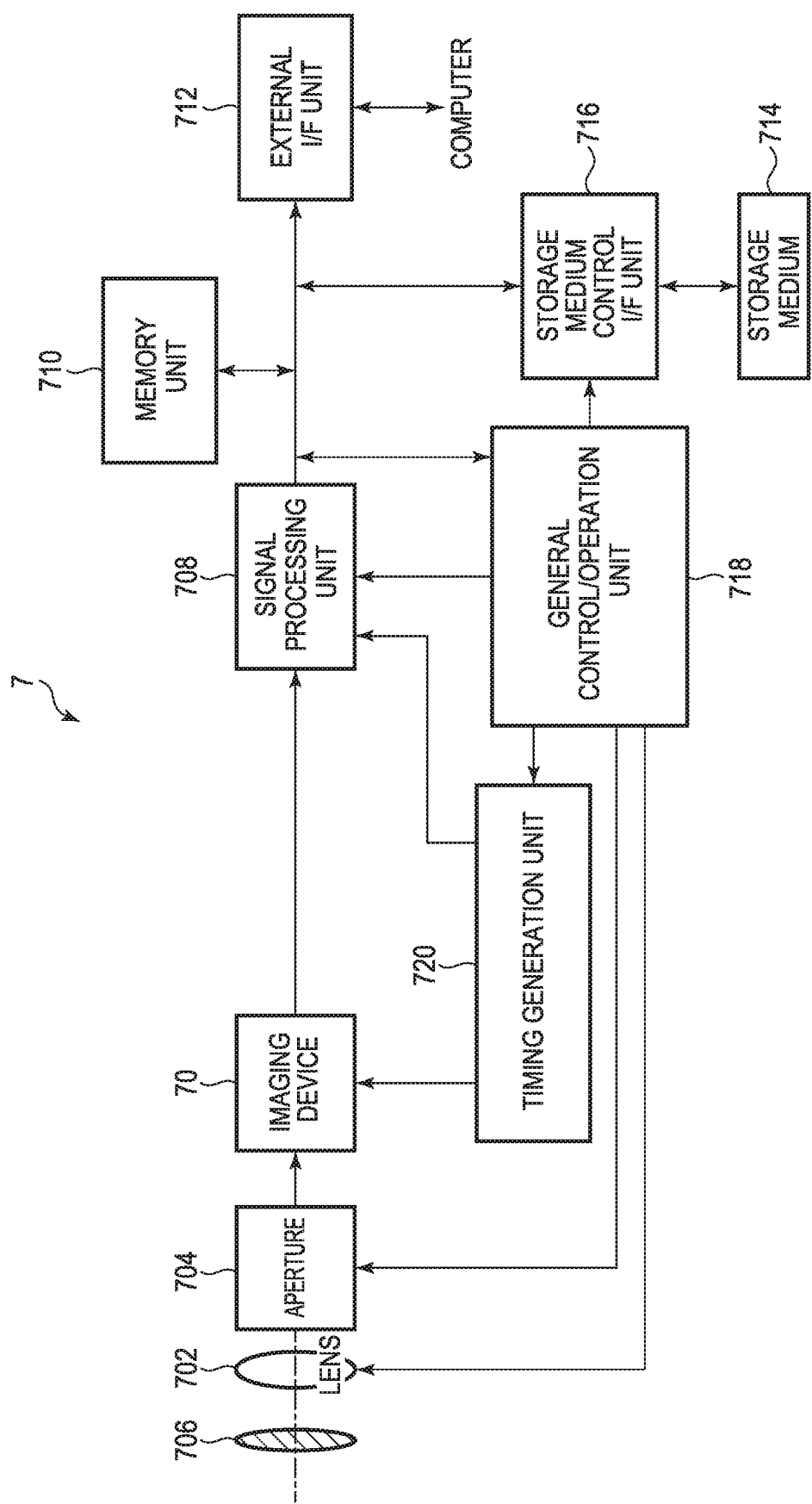
FIG. 16 is a block diagram of an imaging system in a sixth embodiment of the present invention.

An imaging system of a sixth embodiment of the present invention will be described with reference to FIG. 16. FIG. 16 is a block diagram of the imaging system of the present embodiment.

Each photoelectric conversion device in the embodiments described above is applicable to various imaging systems. The imaging system may be a digital still camera, a digital camcorder, a camera head, a copy machine, a fax machine, a mobile phone, an on-vehicle camera, an observation satellite, a surveillance camera, or the like. FIG. 16 illustrates block diagram of a digital still camera as an example of an imaging system.

An imaging system 7 illustrated in FIG. 16 includes a barrier 706, a lens 702, an aperture 704, an imaging device 70, a signal processing unit 708, a timing generation unit 720, a general control/operation unit 718, a memory unit 710, a storage medium control I/F unit 716, a storage medium 714, and an external I/F unit 712. The barrier 706 protects the lens 702, and the lens 702 captures an optical image of an object onto the imaging device 70. The aperture 704 changes the amount of light that has passed through the lens 702. The imaging device 70 is configured as with the photoelectric conversion device of the embodiments described above and converts an optical image captured by the lens 702 into image data. Herein, an analog-to-digital (AD) conversion unit is formed on a semiconductor substrate of the imaging device 70. The signal processing unit 708 performs various correction and data compression on imaging data output from the imaging device 70.

The timing generation unit 720 outputs various timing signals to the imaging device 70 and the signal processing unit 708. The general control/operation unit 718 controls the entire digital still camera, and the memory unit 710 temporarily stores image data. The storage medium control I/F unit 716 is an interface used for storage or reading of image data on the storage medium 714, and the storage medium 714 is a removable storage medium such as a semiconductor memory used for storage or reading of imaging data. The external I/F unit 712 is an interface used for communicating with an external computer or the like. A timing signal or the like may be input from the outside of the imaging system, and the imaging system may be any imaging system having at least the imaging device 70 and the signal processing unit 708 that processes an image signal output from the imaging device 70.

While the imaging device 70 and the AD conversion unit are provided on the separate semiconductor substrates in the present embodiment, the imaging device 70 and the AD conversion unit may be formed on the same semiconductor substrate. Further, the imaging device 70 and the signal processing unit 708 may be formed on the same semiconductor substrate.

Further, each pixel includes a first photoelectric conversion portion and a second photoelectric conversion portion. The signal processing unit 708 may process a pixel signal based on charges generated by the first photoelectric conversion portion and a pixel signal based on charges generated by the second photoelectric conversion portion and acquire distance information on the distance from the imaging device 70 to an object.

Seventh Embodiment

Figure 17A:
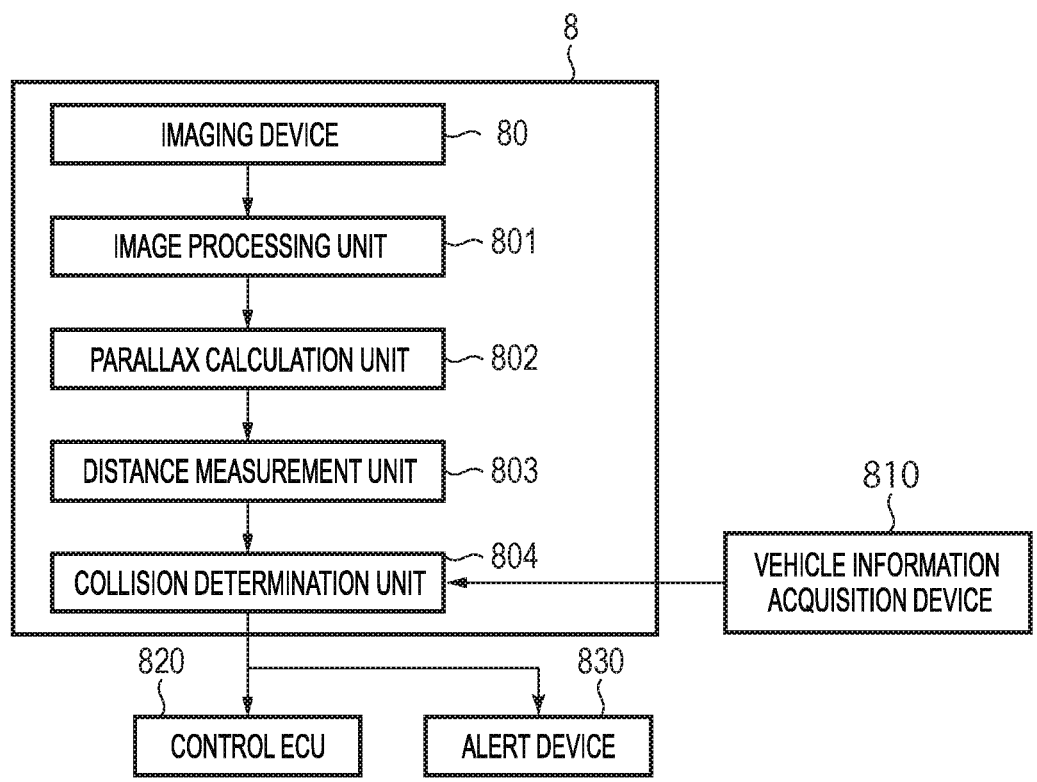
FIG. 17A is a block diagram of an imaging system related to an on-vehicle camera in a seventh embodiment of the present invention.
Figure 17B:
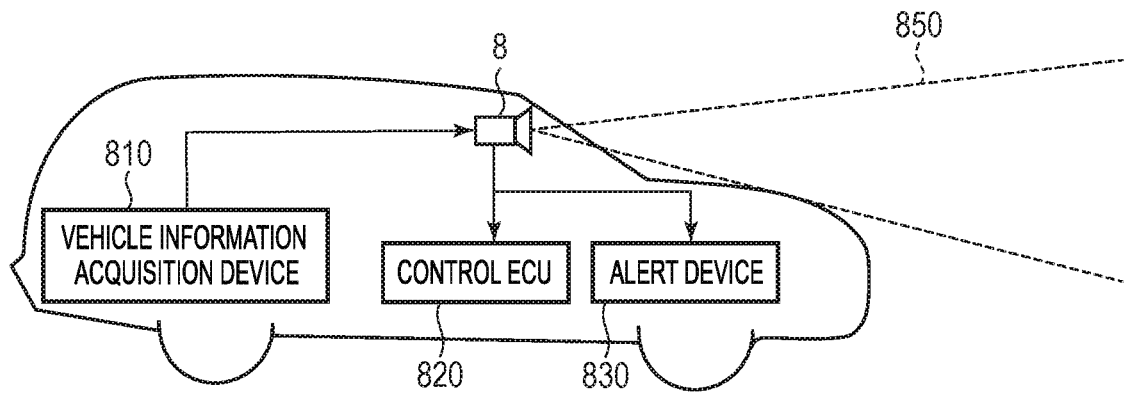
FIG. 17B is a block diagram of the imaging system related to the on-vehicle camera in the seventh embodiment of the present invention.

FIG. 17A and FIG. 17B are block diagrams of an imaging system related to an on-vehicle camera in the present embodiment. An imaging system 8 has an imaging device 80 using the photoelectric conversion device of any of the embodiments described above. The imaging system 8 has an image processing unit 801 that performs image processing on a plurality of image data acquired by the imaging device 80 and a parallax calculation unit 802 that calculates a parallax (a phase difference of parallax images) from the plurality of image data acquired by the imaging system 8. Further, the imaging system 8 has a distance measurement unit 803 that calculates a distance to the object based on the calculated parallax and a collision determination unit 804 that determines whether or not there is a collision possibility based on the calculated distance. Here, the parallax calculation unit 802 and the distance measurement unit 803 are an example of a distance information acquisition device that acquires distance information on the distance to the object. That is, the distance information is information on a parallax, a defocus amount, a distance to an object, or the like. The collision determination unit 804 may use any of the distance information to determine the collision possibility. The distance information acquisition device may be implemented by dedicatedly designed hardware or may be implemented by a software module. Further, the distance information acquisition device may be implemented by a field programmable gate array (FPGA) or an application specific integrated circuit (ASIC) or may be implemented by a combination thereof.

The imaging system 8 is connected to the vehicle information acquisition device 810 and can acquire vehicle information such as a vehicle speed, a yaw rate, a steering angle, or the like. Further, the imaging system 8 is connected to a control ECU 820, which is a control device that outputs a control signal for causing a vehicle to generate braking force based on a determination result by the collision determination unit 804. Further, the imaging system 8 is also connected to an alert device 830 that issues an alert to the driver based on a determination result by the collision determination unit 804. For example, when the collision probability is high as the determination result of the collision determination unit 804, the control ECU 820 performs vehicle control to avoid a collision or reduce damage by applying a brake, pushing back an accelerator, suppressing engine power, or the like. The alert device 830 alerts a user by sounding an alert such as a sound, displaying alert information on a display of a car navigation system or the like, providing vibration to a seat belt or a steering wheel, or the like. The imaging system 8 functions as a control unit that controls the operation of controlling a vehicle as described above.

In the present embodiment, an area around a vehicle, for example, a front area or a rear area is captured by using the imaging system 8. FIG. 17B illustrates the imaging system when a front area of a vehicle (a capturing area 850) is captured. The vehicle information acquisition device 810 as an imaging control unit instructs the imaging system 8 or the imaging device 80 to perform the operation described in the above first to seventh embodiments. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as a subject vehicle and can be applied to a moving unit (moving apparatus) such as a ship, an airplane, a satellite, an industrial robot and a consumer use robot, or the like, for example. In addition, the imaging system can be widely applied to a device which utilizes object recognition or biometric authentication, such as an intelligent transportation system (ITS), a surveillance system, or the like without being limited to moving units.

Modified Embodiments

The present invention is not limited to the embodiments described above, and various modifications are possible. For example, an example in which a part of the configuration of any of the embodiments is added to another embodiment or an example in which a part of the configuration of any of the embodiments is replaced with a part of the configuration of another embodiment is also one of the embodiments of the present invention.

The present invention can also be realized by a process in which a program implementing one or more functions of the embodiments described above is supplied to a system or a device via a network or a storage medium and then one or more processors in a computer of the system or the device read and execute the program. Further, the present invention can be realized by using a circuit (for example, an ASIC) that implements one or more functions.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-192197, filed Oct. 21, 2019, which is hereby incorporated by reference herein in its entirety.

What is claimed is:

1. A photoelectric conversion device comprising:
a semiconductor substrate having a first face and a second face that is arranged on an opposite side of the first face and receives light, and including a first photoelectric conversion portion, a second photoelectric conversion portion, and a third photoelectric conversion portion, wherein the first photoelectric conversion portion, the second photoelectric conversion portion, and the third photoelectric conversion portion are arranged in this order in a horizontal direction of the substrate,
wherein the semiconductor substrate includes:
a first trench extending from the first face between the first photoelectric conversion portion and the second photoelectric conversion portion,
a first insulating layer arranged in the first trench,
a second trench extending from the second face between the second photoelectric portion and the third photoelectric portion, and
a second insulating layer arranged in the second trench,
wherein, along a direction from the first face to the second face, the first insulating layer and another part of the semiconductor substrate are arranged in this order, and a part of the semiconductor substrate and the second insulating layer arranged in this order,
wherein an end on a second face side of the first trench is located closer to the second face than an end on a first face side of the second trench, and
wherein the first trench has a first portion extending from the first face toward the second face, and a second portion extending from a bottom surface of the first portion toward the second face, and a maximum width of the second portion is smaller than a minimum width of the first portion in a cross section taken along a direction in which the first photoelectric conversion portion and the second photoelectric conversion portion are arranged.

2. The photoelectric conversion device according to claim 1, wherein a width of the first trench in a cross section taken along the direction is gradually narrower from a first face side of the first trench to an end side of the first trench.

3. The photoelectric conversion device according to claim 1, wherein the first trench reaches the second face.

4. The photoelectric conversion device according to claim 1, wherein the second trench does not reach the first face.

5. The photoelectric conversion device according to claim 1, wherein in the first face, an insulating isolation structure is formed between the second photoelectric conversion portion and the third photoelectric conversion portion, and an insulating isolation structure is formed between the first photoelectric conversion portion and the second photoelectric conversion portion.

6. The photoelectric conversion device according to claim 5,
wherein the insulating isolation structure is formed so as to surround the first trench in the first face, and
wherein a depth of the insulating isolation structure from the first face is shallower than a depth of the first trench from the first face.

7. The photoelectric conversion device according to claim 5,
wherein the second trench is arranged at a position corresponding to the insulating isolation structure in plan view, and
wherein the second trench is spaced apart from the insulating isolation structure.

8. The photoelectric conversion device according to claim 5 further comprising: a first gate electrode that transfers charges of the first photoelectric conversion portion; and
a second gate electrode that transfers charges of the second photoelectric conversion portion,
wherein the insulating isolation structure formed between the first photoelectric conversion portion and the second photoelectric conversion portion is arranged so as not to overlap the first gate electrode and the second gate electrode in plan view.

9. The photoelectric conversion device according to claim 8, wherein at least a part of the insulating isolation structure formed between the first photoelectric conversion portion and the second photoelectric conversion portion is arranged between the first gate electrode and the second gate electrode in plan view.

10. The photoelectric conversion device according to claim 8,
wherein a distance between the first gate electrode and the second gate electrode is narrower than a distance between the first photoelectric conversion portion and the second photoelectric conversion portion, and
wherein the insulating isolation structure formed between the first photoelectric conversion portion and the second photoelectric conversion portion is not arranged between the first gate electrode and the second gate electrode in plan view.

11. The photoelectric conversion device according to claim 1 further comprising another semiconductor substrate stacked on a first face side of the semiconductor substrate.

12. The photoelectric conversion device according to claim 1, wherein a single micro-lens is formed on a second face side of the semiconductor substrate in association with the first photoelectric conversion portion and the second photoelectric conversion portion.

13. The photoelectric conversion device according to claim 1,
wherein a thickness of the semiconductor substrate is 3.0 μm to 5.0 μm, and
wherein the first trench has a width of 0.1 μm to 0.3 μm and a depth of 1.0 μm to 3.0 μm in a direction in which the first photoelectric conversion portion and the second photoelectric conversion portion are arranged and the second trench has a width of 0.1 μm to 0.5 μm and a depth of 1.0 μm to 3.0 μm in the direction in plan view.

14. An imaging system comprising:
the photoelectric conversion device according to claim 1; and
a signal processing unit that processes an image signal output from the photoelectric conversion device.

15. The photoelectric conversion device according to claim 1, wherein a color filter is formed on a second face side of the semiconductor substrate in association with the first photoelectric conversion portion and the second photoelectric conversion portion.

16. The photoelectric conversion device according to claim 1, wherein the first insulating layer extends along at least a part of a side face of the first trench, and the second insulating layer extends along at least a part of a side face of the second trench.

17. The photoelectric conversion device according to claim 1, wherein the first trench and the second trench are configured to penetrate a third face that is a virtual plane between the first face and the second face and extends along the first face.

18. The photoelectric conversion device according to claim 17, wherein the first insulating layer and the second insulating layer are configured to penetrate the third face.

19. A photoelectric conversion device comprising:
a semiconductor substrate having a first face and a second face that is arranged on an opposite side of the first face and receives light, and including a first photoelectric conversion portion, a second photoelectric conversion portion, and a third photoelectric conversion portion, wherein the first photoelectric conversion portion, the second photoelectric conversion portion, and the third photoelectric conversion portion are arranged in this order in a horizontal direction of the substrate,
wherein the semiconductor substrate includes:
a first trench extending from the first face between the first photoelectric conversion portion and the second photoelectric conversion portion, and including a first insulating layer, and
a second trench extending from the second face between the second photoelectric portion and the third photoelectric portion, and including a second insulating layer,
wherein, along a direction from the first face to the second face, the first insulating layer and another part of the semiconductor substrate are arranged in this order, and a part of the semiconductor substrate and the second insulating layer arranged in this order,
wherein the first trench has a first portion extending from the first face toward the second face, and a second portion extending from a bottom surface of the first portion toward the second face, and a maximum width of the second portion is smaller than a minimum width of the first portion in a cross section taken along a direction in which the first photoelectric conversion portion and the second photoelectric conversion portion are arranged, wherein an end on a second face side of the first trench is located closer to the second face than an end on a first face side of the second trench, and wherein the first trench does not reach the second face.

20. The photoelectric conversion device according to claim 19, wherein the first trench has a portion of a first width and a portion of a second width in a cross section taken along the direction in which the first photoelectric conversion portion and the second photoelectric conversion portion are arranged, the first width is narrower than the second width, and the portion of the first width is closer to the second face than the portion of the second width.

21. The photoelectric conversion device according to claim 19 further comprising another semiconductor substrate stacked on the first face side of the semiconductor substrate.

22. The photoelectric conversion device according to claim 19, wherein a single micro-lens is formed on the second face side of the semiconductor substrate in association with the first photoelectric conversion portion and the second photoelectric conversion portion.

23. The photoelectric conversion device according to claim 19, wherein a color filter is formed on the second face side of the semiconductor substrate in association with the first photoelectric conversion portion and the second photoelectric conversion portion.

24. The photoelectric conversion device according to claim 19, wherein the first insulating layer extends along at least a part of a side face of the first trench, and the second insulating layer extends along at least a part of a side face of the second trench.

25. The photoelectric conversion device according to claim 19, wherein the first trench and the second trench are configured to penetrate a third face that is a virtual plane between the first face and the second face and extends along the first face.

26. The photoelectric conversion device according to claim 25, wherein the first insulating layer and the second insulating layer are configured to penetrate the third face.

27. A system comprising:
the photoelectric conversion device according to claim 19; and
a signal processing unit that processes a signal output from the photoelectric conversion device.

28. A manufacturing method of a photoelectric conversion device comprising steps of:
providing a semiconductor substrate having a first face and a second face that is arranged on an opposite side of the first face;
forming a first photoelectric conversion portion, a second photoelectric conversion portion, and a third photoelectric conversion portion in the semiconductor substrate,
wherein the first photoelectric conversion portion, the second photoelectric conversion portion, and the third photoelectric conversion portion are arranged in this order in a horizontal direction of the substrate;
forming a first trench from the first face by removing a part of the semiconductor substrate;
forming a first insulating layer in the first trench;
forming a second trench from the second face by removing a part of the semiconductor substrate; and
forming a second insulating layer in the second trench,
wherein the first trench is arranged between the first photoelectric conversion portion and the second photoelectric conversion portion, and the second trench is arranged between the second photoelectric conversion portion and the third photoelectric conversion portion,
wherein, along a direction from the first face to the second face, the first insulating layer and another part of the semiconductor substrate are arranged in this order, and a part of the semiconductor substrate and the second insulating layer arranged in this order,
wherein an end on a second face side of the first trench is located closer to the second face than an end on a first face side of the second trench, and
wherein the first trench has a first portion extending from the first face toward the second face and a second portion extending from a bottom surface of the first portion toward the second face, and a maximum width of the second portion is smaller than a minimum width of the first portion in a cross section taken along a direction in which the first photoelectric conversion portion and the second photoelectric conversion portion are arranged.

29. The manufacturing method of the photoelectric conversion device according to claim 28 further comprising a step of stacking another semiconductor substrate on the first face of the semiconductor substrate after the step of forming the first trench and before the step of forming the second trench.

30. The manufacturing method of the photoelectric conversion device according to claim 28 further comprising a step of thinning the semiconductor substrate from a second face side to expose the first trench in the second face after the step of forming the first trench and before the step of forming the second trench.

31. The manufacturing method of the photoelectric conversion device according to claim 28, wherein the step of forming the first trench forms an end of the first trench in a tapered shape by repeating a step of film formation of a polymer on an inner wall of the first trench and a step of etching the end of the first trench.

* * * * *